United States Patent
Shim et al.

(10) Patent No.: US 11,355,195 B2
(45) Date of Patent: Jun. 7, 2022

(54) NONVOLATILE MEMORY DEVICE AND PROGRAM METHOD OF THE SAME

(71) Applicant: Samsung Electronics Co., Ltd., Suwon-si (KR)

(72) Inventors: Won-bo Shim, Seoul (KR); Ji-ho Cho, Suwon-si (KR); Yong-seok Kim, Suwon-si (KR); Byoung-taek Kim, Hwaseong-si (KR); Sun-gyung Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/220,107

(22) Filed: Apr. 1, 2021

(65) Prior Publication Data

US 2021/0217477 A1     Jul. 15, 2021

Related U.S. Application Data

(63) Continuation of application No. 16/553,891, filed on Aug. 28, 2019, now Pat. No. 10,971,232, which is a
(Continued)

(30) Foreign Application Priority Data

Mar. 16, 2017   (KR) .......................... 10-2017-0033210

(51) Int. Cl.
*G11C 16/04*     (2006.01)
*G11C 16/10*     (2006.01)
(Continued)

(52) U.S. Cl.
CPC .......... *G11C 16/10* (2013.01); *G11C 11/5628* (2013.01); *G11C 16/0483* (2013.01);
(Continued)

(58) Field of Classification Search
CPC ..... G11C 16/10; G11C 11/5628; G11C 16/24; G11C 16/0483; H01L 29/7885; H01L 27/1157; H01L 27/11524
See application file for complete search history.

(56) References Cited

U.S. PATENT DOCUMENTS 6,504,754 B2    1/2003   Tran et al.
7,440,323 B2   10/2008   Lutze et al.
(Continued)

FOREIGN PATENT DOCUMENTS

KR    1020130070929 A    6/2013
KR    1020130071689 A    7/2013

OTHER PUBLICATIONS

Wen-Jer Tsai et al. / A Novel Low-Voltage Low-Power Programming Method for NAND Flash Cell by Utilizing Self-Boosting Channel Potential for Carrier Heating / IEEE, vol. 58, No. 6, Jun. 2011 / 8 pages.

*Primary Examiner* — Uyen Smet
(74) *Attorney, Agent, or Firm* — Muir Patent Law, PLLC

(57) ABSTRACT

A program method of a nonvolatile memory device that performs a plurality of program loops is provided. At least one of the plurality of program loops includes dividing a channel of a selected cell string into a first side channel and a second side channel during a first interval and a second interval, turning off a string selection transistor of the selected cell string by applying a string select line voltage of a first level during the first interval, and boosting a first voltage of the first side channel and a second voltage of the second side channel, and turning on the string selection transistor by applying the string select line voltage of a second level different from the first level during the second interval, and performing a hot carrier injection (HCI) pro-
(Continued)

gram operation on a selected memory cell corresponding to the first side channel or the second side channel.

13 Claims, 36 Drawing Sheets

Related U.S. Application Data continuation of application No. 15/870,989, filed on Jan. 14, 2018, now Pat. No. 10,424,381.

(51) Int. Cl.
| | |
|---|---|
| *H01L 29/788* | (2006.01) |
| *G11C 16/34* | (2006.01) |
| *G11C 16/08* | (2006.01) |
| *G11C 11/56* | (2006.01) |
| *G06F 3/06* | (2006.01) |
| *H01L 27/11524* | (2017.01) |
| *H01L 27/1157* | (2017.01) |
| *H01L 27/11582* | (2017.01) |

(52) U.S. Cl.
CPC .......... *G11C 16/08* (2013.01); *G11C 16/3427* (2013.01); *G11C 16/3459* (2013.01); *H01L 29/7885* (2013.01); *G06F 3/0679* (2013.01); *H01L 27/1157* (2013.01); *H01L 27/11524* (2013.01); *H01L 27/11582* (2013.01)

(56) References Cited

U.S. PATENT DOCUMENTS

| | | | |
|---|---|---|---|
| 7,881,112 B2 | 2/2011 | Hsu et al. | |
| 7,952,929 B2 | 5/2011 | Kim et al. | |
| 8,072,810 B2 | 12/2011 | Hsu et al. | |
| 8,531,886 B2 | 9/2013 | Huang et al. | |
| 8,687,424 B2 | 4/2014 | Yoon et al. | |
| 8,755,232 B2 | 6/2014 | Huang et al. | |
| 8,842,479 B2 | 9/2014 | Huang et al. | |
| 8,947,939 B2 | 2/2015 | Tsai et al. | |
| 8,976,581 B2 | 3/2015 | Tsai et al. | |
| 9,171,636 B2 | 10/2015 | Chang et al. | |
| 2007/0025155 A1* | 2/2007 | Hwang | G11C 16/10 |
| | | | 365/185.19 |
| 2008/0025106 A1 | 1/2008 | Kim et al. | |
| 2009/0109762 A1 | 4/2009 | Huang et al. | |
| 2010/0172188 A1 | 7/2010 | Chen et al. | |
| 2010/0214845 A1 | 8/2010 | Choi | |
| 2011/0305088 A1 | 12/2011 | Huang et al. | |
| 2012/0195125 A1* | 8/2012 | Choe | G11C 16/0483 |
| | | | 365/185.15 |
| 2012/0236649 A1 | 9/2012 | Ku et al. | |
| 2013/0088920 A1 | 4/2013 | Huang et al. | |
| 2013/0163345 A1 | 6/2013 | Ahn et al. | |
| 2013/0336057 A1 | 12/2013 | Chung et al. | |
| 2014/0056075 A1 | 2/2014 | Jang | |
| 2014/0104955 A1* | 4/2014 | Kwak | G11C 29/028 |
| | | | 365/185.19 |
| 2014/0254269 A1 | 9/2014 | Dunga et al. | |
| 2016/0118131 A1 | 4/2016 | Dong et al. | |

* cited by examiner

FIG. 14B

LUT

| TEMP | OFFSET |
|------|--------|
| $T_1$ | $V_{off1}$ |
| $T_2$ | $V_{off2}$ |
| ⋮ | ⋮ |
| $T_m$ | $V_{offm}$ |

PS Info.

| BLK0 | ADDR_WL | PS | THV |
|---|---|---|---|
|  | WL_0 | A_0 | TH_0 |
|  | WL_1 | A_1 | |
|  | ⋮ | ⋮ | |
|  | WL_N | A_N | |

⋮

| BLKN | ADDR_WL | PS | THV |
|---|---|---|---|
|  | WL_0 | N_0 | TH_N |
|  | WL_1 | N_1 | |
|  | ⋮ | ⋮ | |
|  | WL_N | N_N | |

NONVOLATILE MEMORY DEVICE AND PROGRAM METHOD OF THE SAME

CROSS-REFERENCE TO RELATED APPLICATION

This application is a Continuation of U.S. patent application Ser. No. 16/553,891, filed on Aug. 28, 2019, now U.S. Pat. No. 10,971,232, which is a Continuation of U.S. patent application Ser. No. 15/870,989, filed on Jan. 14, 2108, now U.S. Pat. No. 10,424,381, which claims priority to Korean Patent Application No. 10-2017-0033210, filed on Mar. 16, 2017, in the Korean Intellectual Property Office, the disclosure of each of which is incorporated herein in its entirety by reference.

BACKGROUND

The embodiments disclosed herein relate to a program method of a nonvolatile memory device, and more particularly, to a nonvolatile memory device performing a program operation through a hot carrier injection, and an operating method of the nonvolatile memory device.

Semiconductor memory devices may be largely classified into volatile semiconductor memory devices and nonvolatile semiconductor memory devices. The volatile semiconductor memory devices may have a quick reading and writing speed, but lose data stored therein when a power supply is cut off. On the other hand, the nonvolatile semiconductor memory devices retain data even when a power supply is stopped. Accordingly, the nonvolatile semiconductor memory devices may be used to store data to be retained regardless of power supply.

Examples of the nonvolatile semiconductor memory devices may include mask read-only memory (MROM), programmable read-only memory (PROM), erasable programmable read-only memory (EPROM), and electrically erasable programmable read-only memory (EEPROM).

A representative example of nonvolatile memory devices may be a flash memory device. A flash memory device is widely used as a voice and image data storage medium of electronic devices, such as a computer, a mobile phone, a personal digital assistant (PDA), a digital camera, a camcorder, a voice recorder, an MP3 player, a handheld personal computer (PC), a game console, a fax machine, a scanner, and a printer. According to a recent increase in demand for high integration of a memory device, a multi-bit flash memory device that stores a multi-bit in one memory cell has been generalized. In general, low power consumption for memory devices is needed as higher integration is implemented.

SUMMARY

The present disclosure provides a nonvolatile memory device capable of reducing overhead of the nonvolatile memory device generated during a program operation and improving an overall program operation performance, and a program method of the nonvolatile memory device.

According to an aspect of the inventive concept, there is provided a program method of a nonvolatile memory device that includes a plurality of memory cells and performs a plurality of program loops on a selected memory cell connected to a selected word line, wherein at least one of the plurality of program loops includes: dividing a channel of a selected cell string into a first side channel and a second side channel based on a switching memory cell connected to a switching word line by applying a switching voltage to the switching word line during a first interval and a second interval; turning off a string selection transistor by applying a string select line voltage of a first level to a gate of the string selection transistor of the selected cell string during the first interval, and boosting a first voltage of the first side channel and a second voltage of the second side channel; and turning on the string selection transistor by applying the string select line voltage of a second level different from the first level during the second interval, and performing a hot carrier injection (HCI) program operation on the selected memory cell corresponding to the first side channel or the second side channel by dropping the boosted first voltage of the first side channel through a selected bit line connected to the selected cell string.

According to another aspect of the inventive concept, there is provided a program method of a nonvolatile memory device that includes a plurality of cell strings each cell string including a plurality of memory cells, the program method including: applying a switching voltage to a switching memory cell disposed between a first memory cell group and a second memory cell group so as to block charge transfer between a first side channel corresponding to the first memory cell group and a second side channel corresponding to the second memory cell group, wherein the first and second memory cell groups are included in a selected cell string; during a first interval, floating the first and second side channels by inactivating a string selection transistor and a ground selection transistor included in the selected cell string, and boosting a voltage of the first side channel and a voltage of the second side channel; and during a successive second interval, performing a hot carrier injection (HCI) program operation on a selected memory cell included in the first memory cell group or the second memory cell group by using a voltage difference between a voltage of the first side channel and a voltage of the second side channel, by activating the string selection transistor to drop the boosted voltage of the first side channel through a selected bit line.

According to another aspect of the inventive concept, there is provided a program method of a nonvolatile memory device including a plurality of cell strings each cell string having a plurality of memory cells, the program method includes performing a plurality of program loops for a first selected memory cell of a selected cell string of the plurality of cell strings. A first program loop of the plurality of program loops is performed by a first program method comprising a method of performing F-N tunneling. A second program loop of the plurality of program loops after the first program loop is performed by a second program method comprising a method of performing a hot carrier injection (HCI) program operation.

According to another aspect of the inventive concept, there is provided a program method of a nonvolatile memory device including a plurality of cell strings each cell string having a plurality of memory cells, the program method including: performing a program operation based on a first program method including a method of performing a hot carrier injection (HCI) program operation, on a first selected memory cell included in a first selected cell string of the plurality of cell strings and connected to a first word line; and performing a program operation based on a second program method not including the method of performing the HCI program operation, on a second selected memory cell included in the first selected cell string and connected to a second word line.

BRIEF DESCRIPTION OF THE DRAWINGS

Embodiments of the present disclosure will be more clearly understood from the following detailed description taken in conjunction with the accompanying drawings in which:

FIGS. 14A and 14B are diagrams for describing a method of selecting a program loop including an HCI program operation, according to example embodiments;

DETAILED DESCRIPTION

Figure 1:
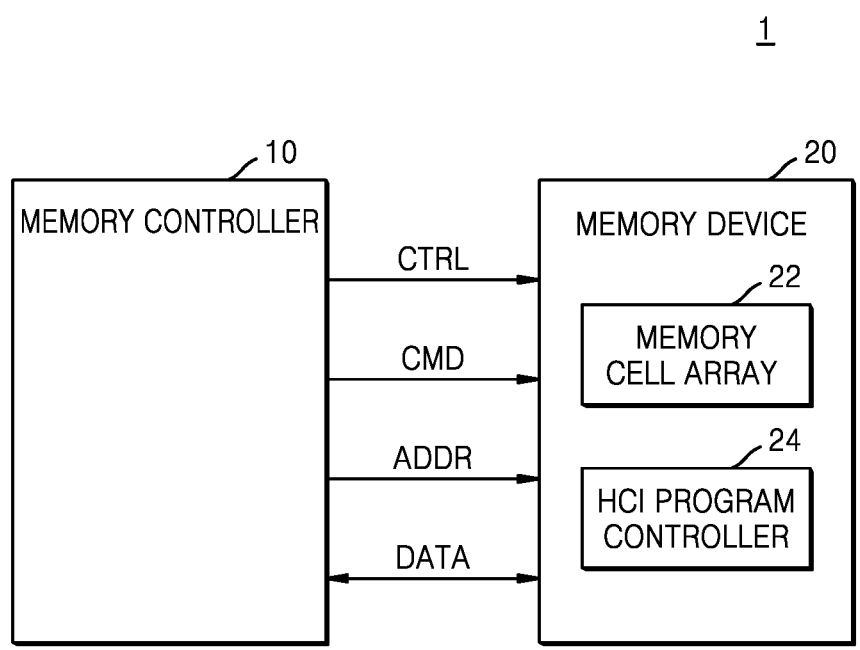
FIG. 1 is a block diagram of a memory system according to example embodiments.

Hereinafter, one or more embodiments will now be described with reference to accompanying drawings.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification.

The embodiments are described, and illustrated in the drawings, in terms of functional blocks, units and/or modules. These blocks, units and/or modules may be physically implemented by electronic (or optical) circuits such as logic circuits, discrete components, microprocessors, hard-wired circuits, memory elements, wiring connections, and the like, which may be formed together in a single integrated circuit (e.g., as a single semiconductor chip) or as separate integrated circuits and/or discrete components (e.g., several semiconductor chips wired together on a printed circuit board) using semiconductor fabrication techniques and/or other manufacturing technologies. These blocks, units and/or modules may be implemented by a processor (e.g., a microprocessor, a controller, a CPU, a GPU) or processors that are programmed using software (e.g., microcode) to perform various functions discussed herein. Each block, unit and/or module may be implemented by dedicated hardware, or as a combination of dedicated hardware to perform some functions and a processor to perform other functions. Also, each block, unit and/or module of the embodiments may be embodied by physically separate circuits and need not be formed as a single integrated circuit.

FIG. 1 is a block diagram of a memory system 1 according to example embodiments.

Figure 2:
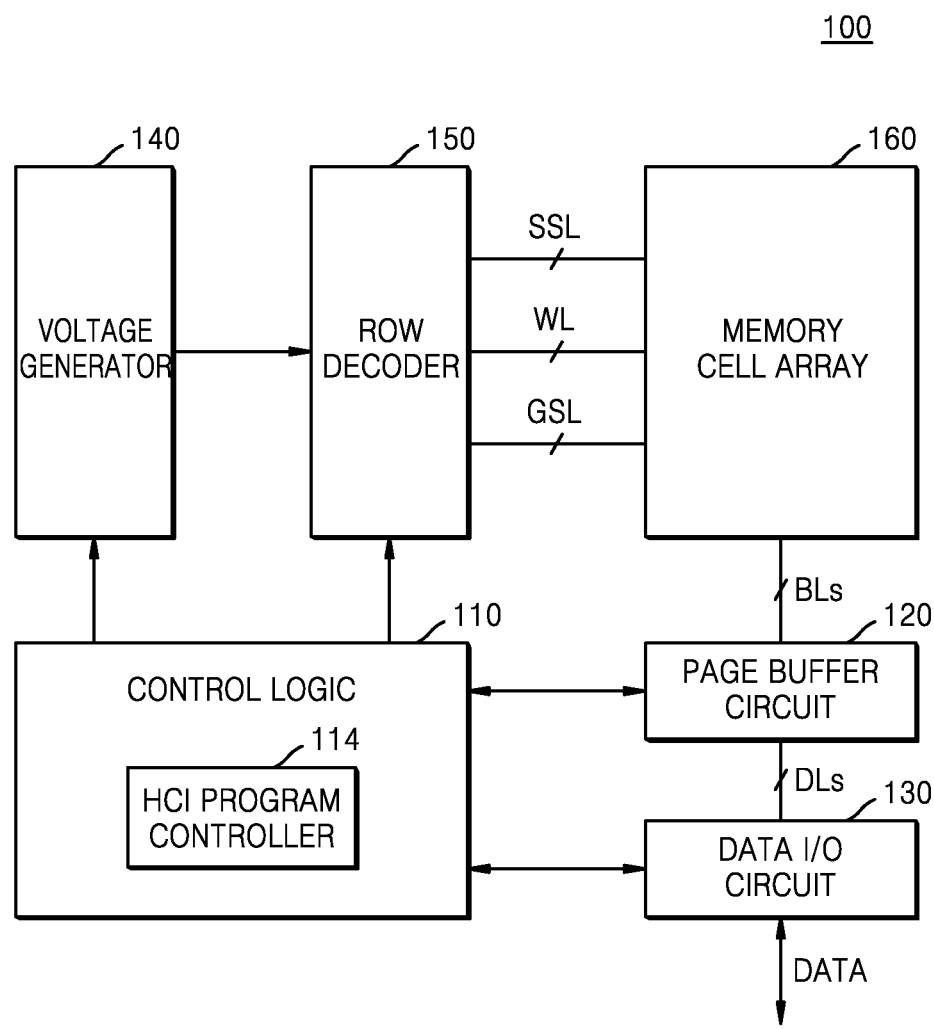
FIG. 2 is a block diagram of a memory device included in the memory system of FIG. 1, according to example embodiments.

Referring to FIG. 1, the memory system 1 may include a memory controller 10 and a nonvolatile memory device 20. Hereinafter, for convenience of description, the nonvolatile memory device 20 will be referred to as the memory device 20. The memory device 20 may include a memory cell array 22 and a hot carrier injection (HCI) program controller 24. However, the memory device 20 of FIG. 1 is only an example, and the HCI program controller 24 may be included in the memory controller 10 or the memory controller 10 may perform the same functions as the HCI program controller 24. Also, the HCI program controller 24 may have any one of various logic forms, and a function of the HCI program controller 24 may be included in a function of a control logic as shown in FIG. 2. Hereinafter, components of the memory controller 10 and the memory device 20 of FIG. 1, according to example embodiments, will be described.

The memory controller 10 may perform control operations on the memory device 20. For example, the memory controller 10 may provide, to the memory device 20, an address ADDR, a command CMD, and a control signal CTRL, so as to control program (or write), read, and erase operations of the memory device 20. The memory cell array 22 may include a plurality of memory cells (not shown) provided in regions where a plurality of word lines (not shown) and a plurality of bit lines (not shown) cross each other. In addition, the memory cell array 22 may include word lines, at least one string select line, and at least one ground select line, and may include a plurality of memory blocks. Each block may include a plurality of memory cell strings, and a memory cell string may include a plurality of memory cells connected in series.

According to an embodiment, the plurality of memory cells may be a plurality of flash memory cells, and the memory cell array 22 may be a NAND flash memory cell array or a NOR flash memory cell array. Hereinafter, example embodiments in which the plurality of memory cells are NAND flash memory cells will be described. However, alternatively, the plurality of memory cells may be NOR flash memory cells, resistive memory cells, such as resistive random access memory (RRAM) cells, phase change RAM (PRAM) cells, or magnetic RAM (MRAM) cells, according to other example embodiments.

The HCI program controller 24 according to an embodiment may control performing of an HCI program operation while performing an operation of programming data DATA received from the memory controller 10 on a memory cell. The memory device 20 may perform a plurality of program loops to program the data DATA on the memory cell, and the HCI program controller 24 may control an HCI program operation to be performed on a selected memory cell while performing at least one of the plurality of program loops. First, the HCI program controller 24 may apply a switching voltage to a switching word line in a first interval and a second interval so as to divide a channel of a selected cell string into a first side channel and a second side channel based on a switching memory cell connected to a switching word line. For example, the switching word line may be disposed adjacent to a selected word line connected to the selected memory cell to be programmed. However, this is only an example, and at least one word line may be disposed between the switching word line and the selected word line.

According to an embodiment, a sufficient switching voltage to block charge flow between the first side channel and the second side channel may be applied to the switching memory cell. However, this is only an example, and alternatively, a switching voltage for restricting only minimum charge to flow between the first side channel and the second side channel may be applied to the switching memory cell. According to an embodiment, the HCI program controller 24 may transit a level of the switching voltage applied to the switching memory cell in the first interval to another level in the second interval so as to adjust the amount of electrons injected to the selected memory cell according to the HCI program operation. In an exemplary embodiment, a ground voltage may be applied to the switching memory cell during the first and second intervals.

An interval of performing a program loop includes an interval of performing a program operation and an interval of performing a verification operation, wherein the interval of performing a program operation may include the first interval and the second interval. According to an embodiment, the first side channel may correspond to at least one memory cell disposed between the switching memory cell and a string selection transistor, from among the plurality of memory cells of the selected cell string. The second side channel may correspond to at least one memory cell disposed between the switching memory cell and a ground selection transistor, from among the plurality of memory cells of the selected cell string. Also, the memory cell corresponding to the second side channel may include the selected memory cell. However, alternatively, the memory cell corresponding to the first side channel may include the selected memory cell. Hereinafter, for convenience of description, the selected word line and the switching word line are disposed adjacent to each other, and the memory cell corresponding to the second side channel includes the selected memory cell.

For example, the HCI program controller 24 may float each of the first side channel and the second side channel in the first interval, and then boost a voltage of the first side channel and a voltage of the second side channel. For example, the HCI program controller 24 may float each of the first side channel and the second side channel by controlling the string selection transistor and the ground selection transistor. Also, the HCI program controller 24 may boost the voltages of the first and second side channels by controlling a pass voltage to be applied to the memory cell corresponding to the first side channel and controlling a program voltage and a pass voltage to be applied to the memory cell corresponding to the second side channel. Also, the HCI program controller 24 may boost the voltages of the first and second side channels differently so as to adjust the amount of charges injected to the selected memory cell according to the HCI program operation.

The HCI program controller 24 may couple the selected bit line to the selected cell string by controlling the string selection transistor in the second interval. Since a ground voltage (0 V) is uniformly applied, as a bit line selection voltage, to the selected bit line in the first and second intervals, charges of the first side channel escape through the selected bit line, and as a result, the boosted voltage of the first side channel may drop. The HCI program controller 24 may perform the HCI program operation on the selected memory cell by using the program voltage applied to the selected memory cell and a difference between the voltages of the first and second side channels.

Also, the HCI program controller 24 may control the HCI program operation to be performed when only a program loop selected from the plurality of program loops is performed. According to an embodiment, the HCI program controller 24 may select a first set of program loops to be performed after an $N^{th}$ reference program loop performed at the $N^{th}$ order in a time sequence from among the plurality of program loops, and control the HCI program operation to be performed when the first set of program loops is performed. Also, according to an embodiment, the HCI program controller 24 may select a second set of program loops using a program voltage of a reference voltage level or higher from among the plurality of program loops, and control the HCI program operation to be performed when the second set of program loops is performed.

According to an embodiment, when the memory cell array 22 is a 3-dimensional (3D) memory cell array, the HCI program controller 24 may determine whether to include the HCI program operation to at least one program loop from among the plurality of program loops, based on a location of the selected word line. For example, when the selected word line is included in a word line between a pre-set reference word line and the string select line, the HCI program controller 24 may determine to include the HCI program operation in the at least one program loop from among the plurality of program loops performed on the selected memory cell while performing the program operation. The reference word line may be set differently based on characteristics of the 3D memory cell included in the memory cell array 22, and the memory device 20 may receive and store, in a certain register, setting information from the memory controller 10, and use the setting information while performing the program operation.

According to an embodiment, the memory device 20 may perform a program loop including a HCI program operation so as to program certain data in the memory cell, thereby performing an efficient program operation and increasing program performance. Hereinafter, one or more embodiments will now be described in detail, and expected effects of each embodiment will be described.

FIG. 2 is a block diagram of a memory device 100 included in the memory system 1 of FIG. 1, according to example embodiments.

Referring to FIG. 2, the memory device 100 may include a control logic 110, a page buffer circuit 120, a data input/output (I/O) circuit 130, a voltage generator 140, a row decoder 150, and a memory cell array 160.

The memory cell array 160 may be connected to the row decoder 150 through string select lines SSLs, a plurality of word lines WLs and ground select lines GSLs, and connected to the data I/O circuit 130 through the bit lines BLs. The memory cell array 160 may include a plurality of memory blocks.

Each memory block of the memory cell array 160 may include a plurality of NAND cell strings. Each cell string may form a channel in a vertical or horizontal direction. A plurality of word lines may be stacked in a vertical direction in the memory cell array 160. Each of the word lines may form a control gate of a memory cell included in the cell string. In this case, a channel of the memory cell may be formed in a vertical direction.

According to an arrangement of the memory cell array 160, the cell strings sharing one bit line BL may be individually selected. The individually selected cell strings may be connected to the plurality of ground select lines GSLs that are electrically separated from each other. Accordingly, each of the channels of the cell strings sharing one bit line BL may be selectively pre-charged through control of the ground select lines GSLs. For example, the plurality of cell strings may be connected to a bit line to which 0 V is applied for programming (hereinafter, referred to as a selected bit line).

The row decoder 150 may select one of the word lines WLs of the memory cell array 160 by decoding an address ADDR. The control logic 110 may include a row address buffer, and the row address buffer may receive the address ADDR and provide an address output signal to the row decoder 150. The row decoder 150 may provide a word line voltage provided from the voltage generator 140 to the selected word line of the memory cell array 160. For example, during a program operation, the row decoder 150 may apply a program voltage to the selected word line and apply a pass voltage to unselected word lines. Also, the row decoder 150 may provide a selection voltage to a selected string select line SSL.

The page buffer circuit 120 may operate as a write driver or sense amplifier according to an operation performed by the control logic 110. During a program operation, the page buffer circuit 120 may provide a voltage corresponding to data to be programmed, to the bit lines BLs of the memory cell array 160. During a read operation, the page buffer circuit 120 may detect data stored in a selected memory cell through the bit lines BLs, and provide the data to the data I/O circuit 130.

The data I/O circuit 130 may be connected to the page buffer circuit 120 through data lines DLs, and may provide the data DATA to the page buffer circuit 120 or externally output the data DATA received from the page buffer circuit 120. In example embodiments, the data I/O circuit 130 may provide an input address or command to the control logic 110 or the row decoder 150.

The control logic 110 may include an HCI program controller 114. The control logic 110 may control program, read, and erase operations in response to a command received from the data I/O circuit 130. The HCI program controller 114 may control a suitable voltage to be applied to the string select lines SSLs, the word lines WLs, the ground select lines GSLs, and the bit lines BLs in order to control the HCI program operation while performing a program loop. For example, when the control logic 110 controls a program operation of performing a plurality of program loops, the HCI program controller 114 may control the HCI program operation to be performed within the program loop. In particular, the HCI program controller 114 may transit a level of a string select line voltage applied to the string select lines SSLs to control the HCI program operation. Details thereof will be described below.

Figure 3:
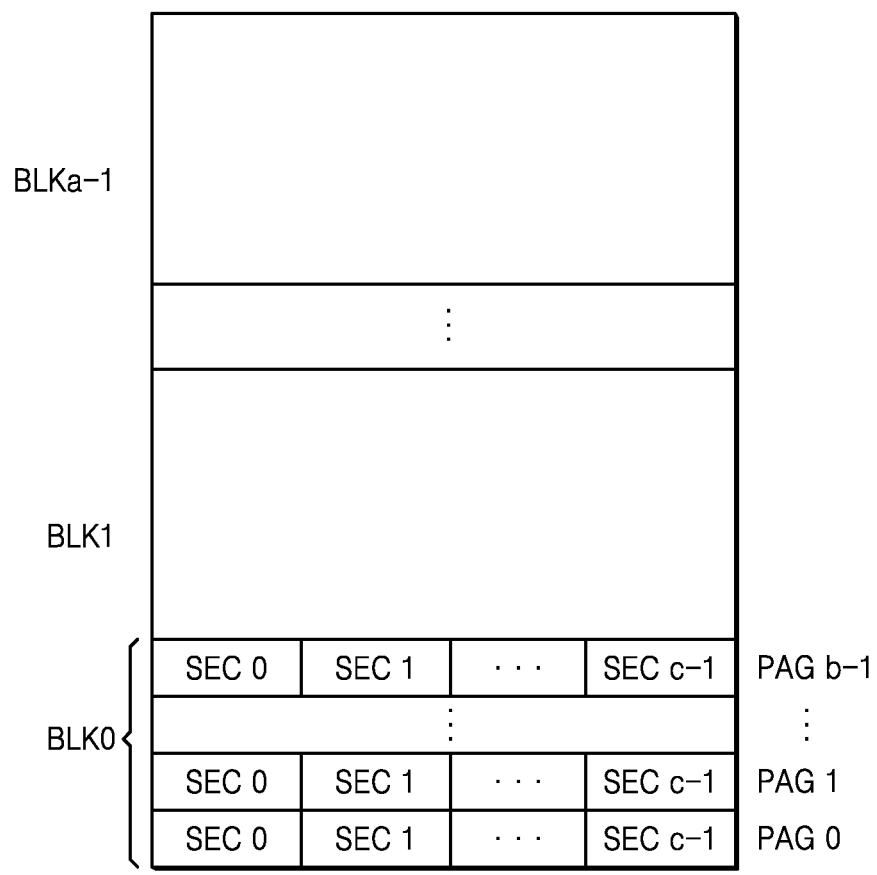
FIG. 3 illustrates an example of a memory cell array included in the memory device of FIG. 2, according to example embodiments.

FIG. 3 illustrates an example of the memory cell array 160 included in the memory device 100 of FIG. 2, according to example embodiments.

Referring to FIG. 3, the memory cell array 160 of FIG. 2 may be a flash memory cell array. Here, the memory cell array 160 may include a plurality of memory blocks BLK0 through BLKa-1, wherein a is an integer of 2 or greater, each of the memory blocks BLK0 through BLKa-1 may include b pages PAG0 through PAGb-1, wherein b is an integer of 2 or greater, and each of the pages PAG0 through PAGb-1 may include c sectors SEC0 through SECc-1, wherein c is an integer of 2 or greater. In FIG. 3, the pages PAG0 through PAGb-1 and the sectors SEC0 through SECc-1 are shown only with respect to the memory block BLK0 for convenience of illustration, but the other blocks BLK1 through BLKa-1 may have the same structure as the memory block BLK0.

Figure 4A:
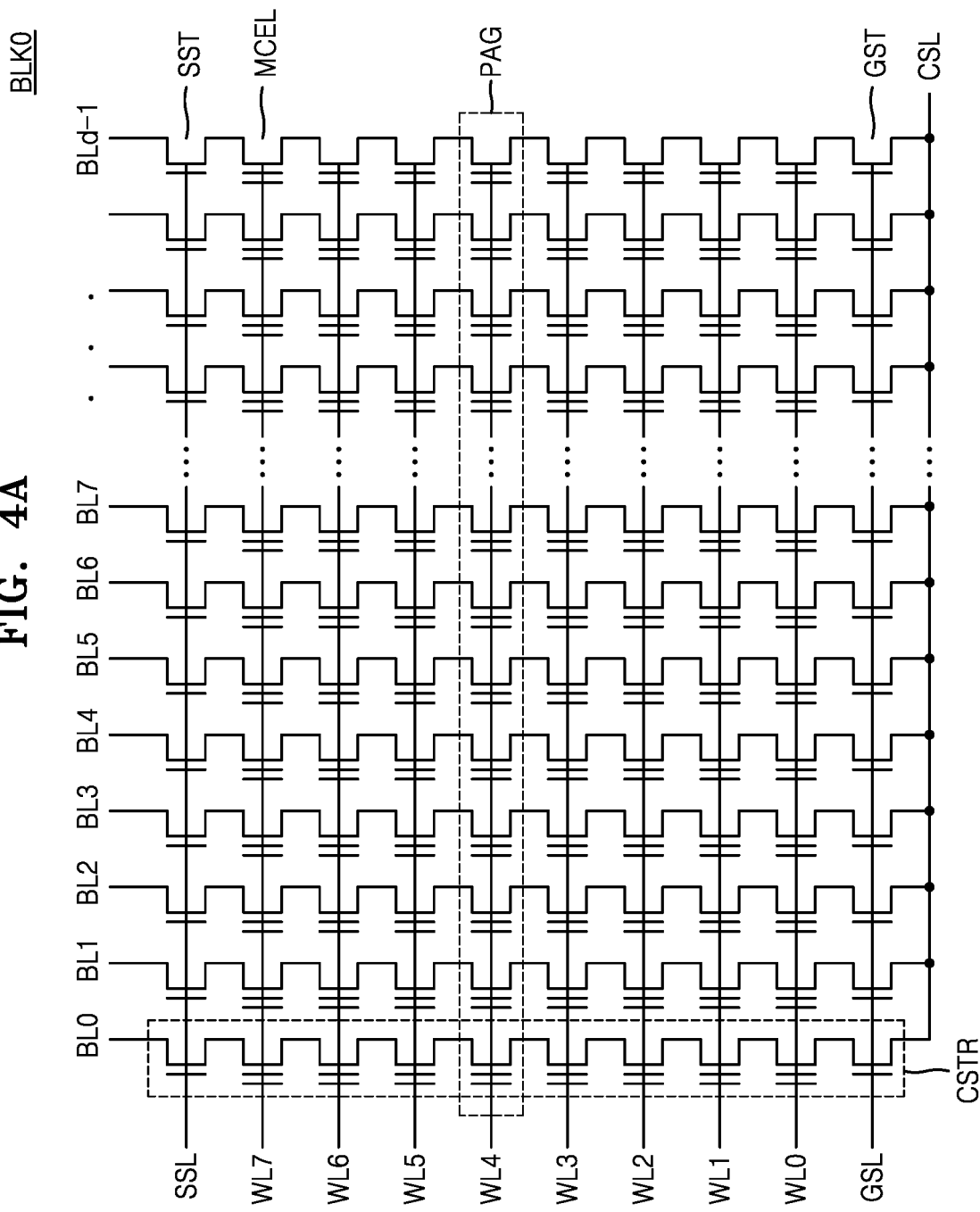
FIG. 4A is a circuit diagram of a memory block included in the memory cell array of FIG. 3, according to example embodiments.

FIG. 4A is a circuit diagram of the memory block BLK0 included in the memory cell array 160 of FIG. 3, according to example embodiments.

Referring to FIG. 4A, the memory cell array 160 of FIG. 3 may be a memory cell array of a NAND flash memory. Here, each of the memory blocks BLK0 through BLKa-1 of FIG. 3 may be realized as the memory block BLK0 of FIG. 4A. Referring to FIG. 4A, the memory block BLK0 may include d cell strings CSTR, wherein d is an integer of 2 or greater, to which 8 memory cells MCEL are connected in series, in a direction of bit lines BL0 through BLd-1. Each of the cell strings CSTR may include a string selection transistor SST and a ground selection transistor GST respectively connected to two ends of the memory cells MCEL connected to the cell string CSTR in series. Also, the string selection transistor SST may be connected to the string select line SSL, and the ground selection transistor GST may be connected to the ground select line GSL.

A NAND flash memory device including the memory block BLK0 of FIG. 4A performs an erase operation in block units, and performs a program operation in units of pages PAG corresponding to each of word lines WL0 through WL7. In FIG. 4A, the memory block BLK0 includes the 8 pages PAG with respect to the 8 word lines WL0 through WL7. However, the memory blocks BLK0 through BLKa-1 of the memory cell array 160 according to example embodiments may include different numbers of memory cells MCEL and pages PAG. Also, the memory device 100 of FIG. 3 may include a plurality of memory cell arrays each performing the same operations and having the same structure as the memory cell array 160 described above.

Figure 4B:
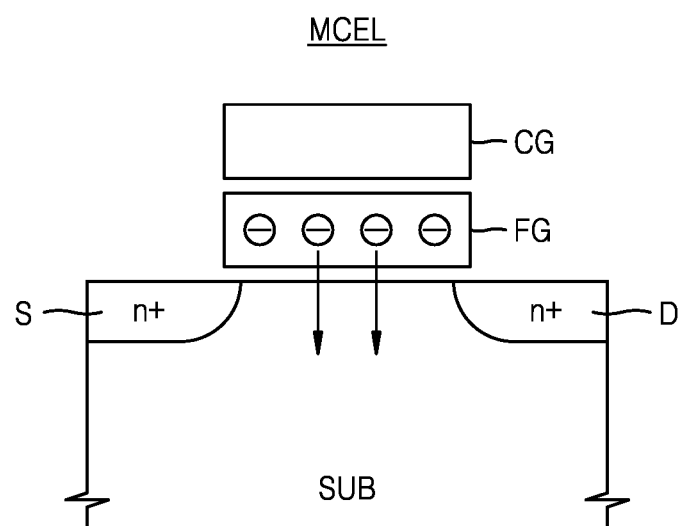
FIG. 4B is a cross-sectional view of a memory cell included in the memory block of FIG. 4A, according to example embodiments.

FIG. 4B is a cross-sectional view of the memory cell MCEL included in the memory block BLK0 of FIG. 4A, according to example embodiments.

Referring to FIG. 4B, a source S and a drain D are formed over a substrate SUB, and a channel may be formed between the source S and the drain D. A floating gate FG is formed over the channel, and an insulating layer, such as a tunneling insulating layer, may be provided between the channel and the floating gate FG. A control gate CG is formed over the floating gate FG, and an insulating layer, such as a memory blocking insulating layer, may be provided between the floating gate FG and the control gate CG. Voltages required for program, erase, and read operations performed on the memory cell MCEL may be applied to the substrate SUB, the source S, the drain D, and the control gate CG.

In a flash memory device, data stored in the memory cell MCEL may be read by distinguishing a threshold voltage Vth of the memory cell MCEL. Here, the threshold voltage Vth of the memory cell MCEL may be determined according to the amount of electrons stored in the floating gate FG. For example, the threshold voltage Vth of the memory cell MCEL may be high when the amount of electrons stored in the floating gate FG is large.

When the memory cell MCEL is a multi-bit level cell in which data of 2 bits or greater is programmed, a program voltage of a very high level may be needed in order to prepare a desired program state of the memory cell MCEL during a program operation using only F-N tunneling. When the program voltage of a very high level is applied to a memory cell array including the memory cell MCEL, disturbance may be generated during verification, read, and erase operations performed later, and overall performance of a memory device may be deteriorated due to an overhead in a periphery circuit including the voltage generator 140 of FIG. 2. Accordingly, the memory device 100 according to example embodiments may additionally perform an HCI program operation that is efficiently controllable, as described below.

Figure 5:
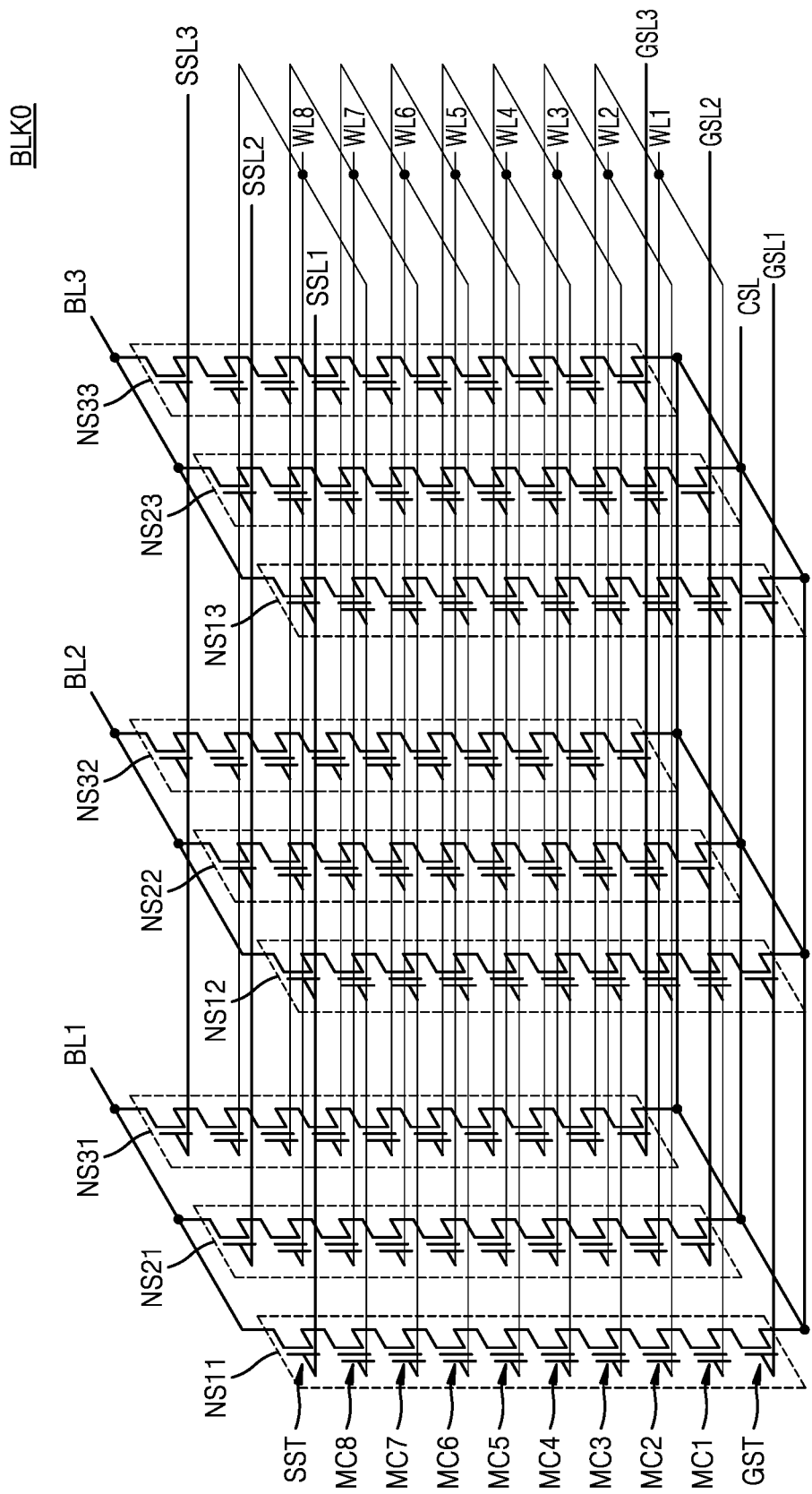
FIG. 5 is a circuit diagram of a memory block included in the memory cell array of FIG. 3, according to other example embodiments.

FIG. 5 is a circuit diagram of the memory block BLK0 included in the memory cell array 160 of FIG. 3, according to other example embodiments.

Referring to FIG. 5, the memory cell array 160 of FIG. 3 may be a memory cell array of a 3D NAND flash memory (or vertical NAND flash memory), and may include a plurality of memory blocks. Here, each of the memory blocks BLK0 through BLKa-1 of FIG. 3 may have the same structure as the memory block BLK0 of FIG. 5. Referring to FIG. 5, the memory block BLK0 may include a plurality of NAND strings (or, NAND cell strings) NS11 through NS33, a plurality of word lines WL1 through WL8, first through third bit lines BL1 through BL3, a plurality of ground select lines GSL1 through GSL3, first through third string select lines SSL1 through SSL3, and a common source line CSL. Here, the numbers of NAND strings, word lines, bit lines, ground select lines, and string select lines may vary according to example embodiments.

The NAND strings NS11, NS21, and NS31 are connected between the first bit line BL1 and the common source line CSL, the NAND strings NS12, NS22, and NS32 are connected between the second bit line BL2 and the common source line CSL, and the NAND strings NS13, NS23, and NS33 are connected between the third bit line BL3 and the common source line CSL. Each of the NAND strings NS11 through NS33 may include a string selection transistor SST, a plurality of memory cells MC1 through MC8, and a ground selection transistor GST, which are connected to each of the NAND strings NS11 through NS33 in series. Hereinafter, a NAND string will be referred to as a string for convenience.

Strings commonly connected to one bit line form a column. For example, the strings NS11, NS21, and NS31 commonly connected to the first bit line BL1 may correspond to a first column, the strings NS12, NS22, and NS32 commonly connected to the second bit line BL2 may correspond to a second column, and the strings NS13, NS23, and NS33 commonly connected to the third bit line BL3 may correspond to a third column.

Strings connected to one string select line form one row. For example, the strings NS11, NS12, and NS13 connected to the first string select line SSL1 may correspond to a first row, the strings NS21, NS22, and NS23 connected to the second string select line SSL2 may correspond to a second row, and the strings NS31, NS32, and NS33 connected to the third string select line SSL3 may correspond to a third row.

The string selection transistor SST is connected to the corresponding first through third string select lines SSL1 through SSL3. The memory cells MC1 through MC8 are respectively connected to the word lines WL1 through WL8. The ground selection transistor GST is connected to the corresponding ground select lines GSL1 through GSL3. The string selection transistor SST is connected to the corresponding first through third bit lines BL1 through BL3, and the ground selection transistor GST is connected to the common source line CSL.

According to example embodiments, word lines at the same height (for example, the word line WL1) are commonly connected to each other, the first through third string select lines SSL1 through SSL3 are separated from each other, and the ground select lines GSL1 through GSL3 are separated from each other. For example, when memory cells connected to the word line WL1 and included in the strings NS11, NS12, and NS13 are programmed, the word line WL1 and the first string select line SSL1 are selected. According to other example embodiments, the ground select lines GSL1 through GSL3 may be commonly connected to each other.

Figure 6:
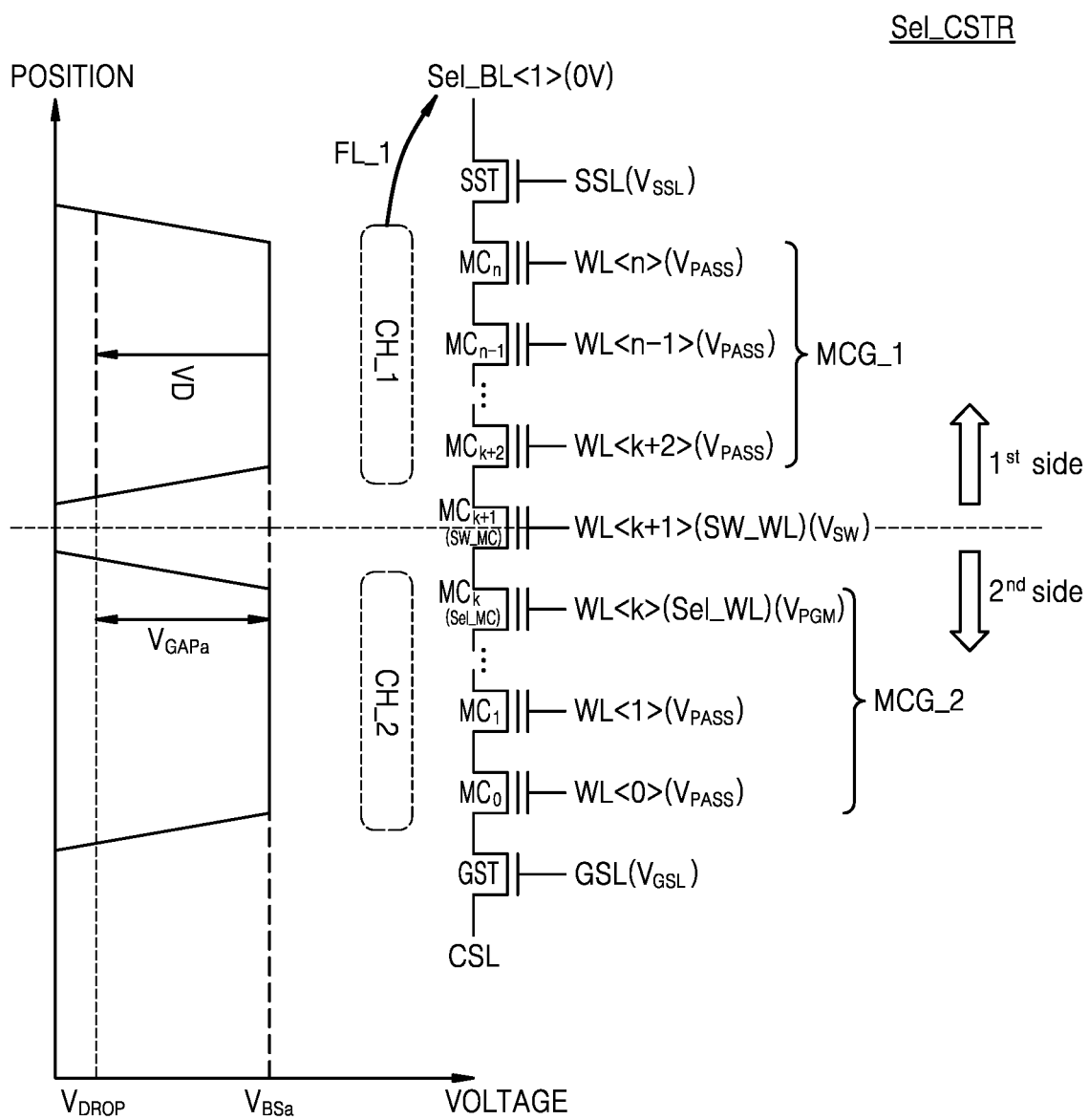
FIG. 6 illustrates a selected cell string and a channel voltage of the selected cell string to describe a hot carrier injection (HCI) program operation, according to example embodiments.
Figure 7A:
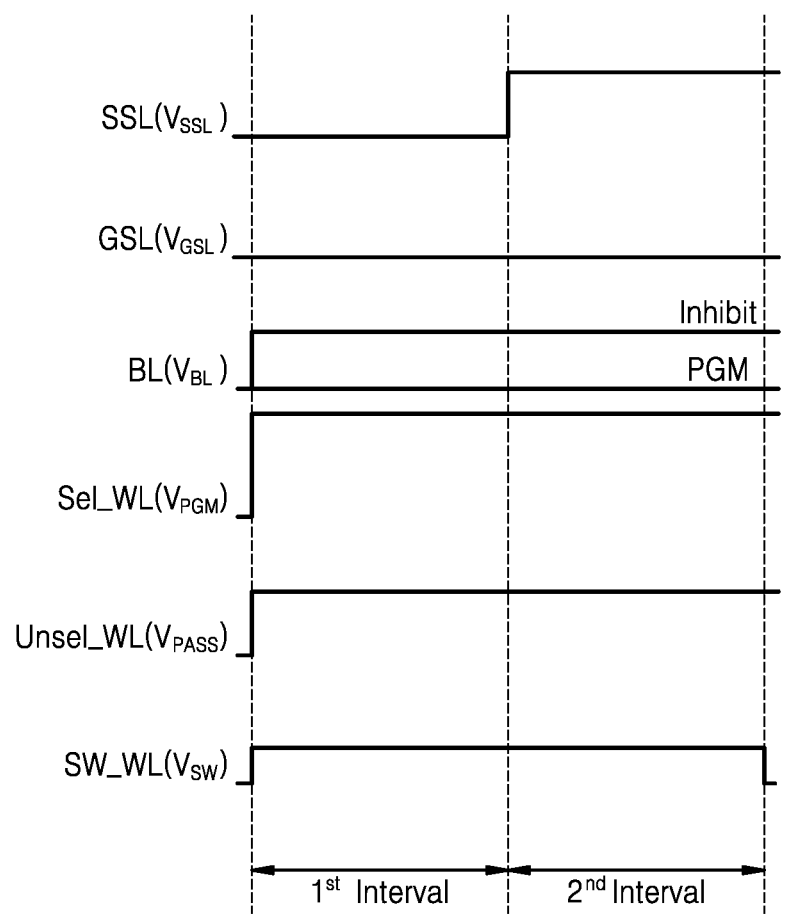
FIGS. 7A through 7C are timing diagrams for describing HCI program operations according to example embodiments.
Figure 7B:
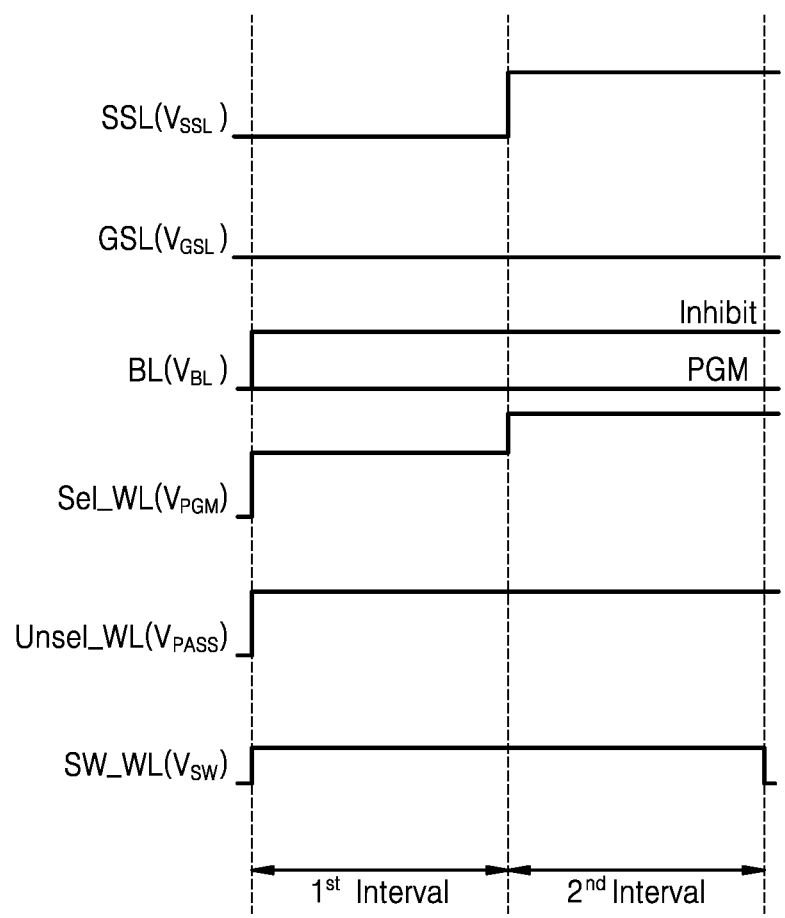
Figure 7C:
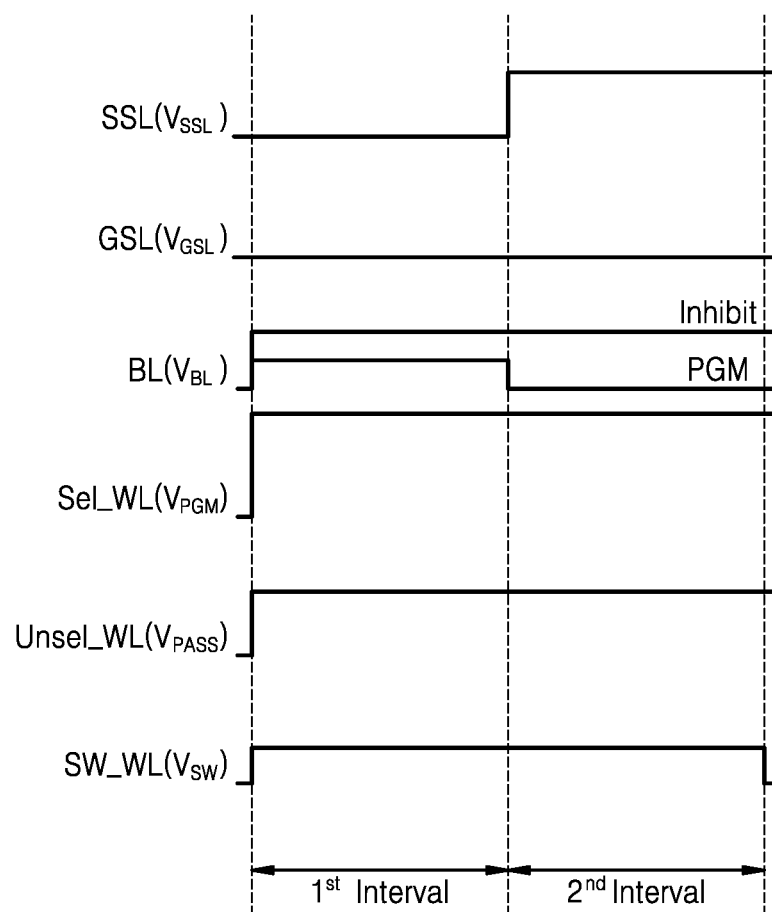

FIG. 6 illustrates a selected cell string Sel_CSTR and a channel voltage of the selected cell string Sel_CSTR to describe an HCI program operation, according to example embodiments, and FIGS. 7A through 7C are timing diagrams for describing HCI program operations according to example embodiments.

Referring to FIGS. 2, 3, 4A, 4B, 5, and 6, the selected cell string Sel_CSTR may include a string selection transistor SST, a ground selection transistor GST, and a plurality of memory cells $MC_0$ through $MC_n$. Here, n is a natural number greater than 2. The string selection transistor SST may be connected to the string select line SSL, the ground selection transistor GST may be connected to the ground select line GSL, and the plurality of memory cells $MC_0$ through $MC_n$ may be respectively connected to word lines WL<0> through WL<n>. According to an embodiment, the plurality of memory cells $MC_0$ through $MC_n$ may include a selected memory cell Sel_MC on which a program operation is to be performed, and a switching memory cell SW_MC adjacent to the selected memory cell Sel_MC. In an example embodiment, the switching memory cell SW_MC may be a memory cell most adjacent to the selected memory cell Sel_MC from among the plurality of memory cells $MC_0$ through $MC_n$ disposed on a first side based on the selected memory cell Sel_MC. For example, the first side may be disposed adjacent to a string selection transistor SST. In another example embodiment, the switching memory cell SW_MC may be a memory cell most adjacent to the selected memory cell Sel_MC from among memory cells disposed on a second side based on the selected memory cell Sel_MC. For example, the second side may be disposed adjacent to a ground selection transistor GST. In another example embodiment, a plurality of memory cells adjacent to the selected memory cell Sel_MC based on the selected memory cell Sel_MC may be set as the switching memory cells SW_MC. The switching memory cell SW_MC may be differently selected according to the selected memory cell Sel_MC on which the program operation is to be performed. Hereinafter, it is described that the memory cell $MC_k$ is selected as the selected memory cell Sel_MC and the memory cell $MC_{K+1}$ adjacent to the selected memory cell Sel_MC, i.e., the memory cell $MC_{k+1}$, is indicated as the switching memory cell SW_MC.

The HCI program controller 114 may control the HCI program operation while performing a certain program loop on the selected memory cell Sel_MC, i.e., the memory cell $MC_k$, connected to a selected word line Sel_WL from among the plurality of memory cells $MC_0$ through $MC_n$ included in the selected cell string Sel_CSTR connected to a selected bit line Sel_BL<1>. The HCI program controller 114 may control a suitable voltage to be applied to each of the word lines WL<0> through WL<n>, the selected bit line Sel_BL<1>, the string select line SSL, and the ground select line GSL.

A program operation may include a plurality of program loops, and each of the plurality of program loops may include F-N tunneling operation and/or an HCI program operation. As one example, a program operation on a first selected memory cell of the selected cell string may be performed by F-N tunneling in a first group of the plurality of program loops and by HCI program operation in the rest of the plurality of program loops. As another example, a program operation on a second selected memory cell of the selected cell string may be performed only by F-N tunneling in the plurality of program loops.

Referring to FIG. 7A, a timing diagram is described in a particular program loop among the plurality of program loops. The particular program loop may include an HCI program operation. The HCI program controller 114 may control a switching voltage $V_{SW}$ having a certain level to be applied to a switching word line SW_WL connected to the switching memory cell SW_MC, i.e., the memory cell $MC_{k+1}$, during the first interval. The switching voltage $V_{SW}$ may have a level lower than a pass voltage $V_{PASS}$, and a flow of charges between a first side channel CH_1 and a second side channel CH_2 may be blocked by the switching memory cell SW_MC, i.e., the memory cell $MC_{k+1}$. As a result, a channel of the selected cell string Sel_CSTR may be divided into the first side channel CH_1 and the second side channel CH_2. For example, the first side channel CH_1 may be a channel corresponding to the memory cells $MC_{K+2}$ through $MC_n$ provided on the first side based on the switching memory cell SW_MC, i.e., the memory cell $MC_{K+1}$. A first memory cell group MCG_1 may include at least one memory cell corresponding to the first side channel CH_1. The second side channel CH_2 may be a channel corresponding to the memory cells $MC_0$ through $MC_k$ provided on the second side based on the switching memory cell SW_MC, i.e., the memory cell $MC_{K+1}$. A second memory cell group MCG_2 may include at least one memory cell corresponding to the second side channel CH_2. For example, the plurality of memory cells $MC_0$ through $MC_n$ included in the selected cell string Sel_CSRT may be divided into the first memory cell group MCG_1 and the second memory cell group MCG_2 based on the switching memory cell SW_MC, i.e., the memory cell $MC_{K+1}$.

In example embodiments, a voltage level of the switching voltage $V_{SW}$ may be lower than 5V, and a voltage level of the pass voltage $V_{PASS}$ may be between 5V and 10V.

The HCI program controller 114 may control a string select line voltage $V_{SSL}$ of a ground voltage level to be applied to the string select line SSL connected to the string selection transistor SST, and control a ground select line voltage $V_{GSL}$ of the ground voltage level to be applied to the ground select line GSL connected to the ground selection transistor GST, during the first interval. For example, each of the string selection transistor SST and the ground selection transistor GST may be turned off, and the selected cell string Sel_CSTR may be decoupled from each of the selected bit line Sel_BL<1> and the common source line CSL. Accordingly, the first and second side channels CH_1 and CH_2 may be floated. Also, the HCI program controller 114 may control a bit line selection voltage $V_{BL}$(PGM) of the ground voltage level to be applied to the selected bit line Sel_BL<1> to be programmed, and control an inhibit voltage $V_{BL}$(Inhibit) of a certain voltage level to be applied to an unselected bit line to be inhibited, during the first interval.

The HCI program controller 114 may control the pass voltage $V_{PASS}$ of a certain level to be applied to unselected word lines Unsel_WL, i.e., the word lines WL<0> through WL<k−1> and WL<k+2> through WL<n>, and control a program voltage $V_{PGM}$ of a certain level to be applied to the selected word line Sel_WL, i.e., the word line WL<k>, during the first interval. Accordingly, a voltage of the first side channel CH_1 and a voltage of the second side channel CH_2 may be boosted to a first boosting voltage $V_{BSa}$. The first boosting voltage $V_{BSa}$ may be changed according to a level of the pass voltage $V_{PASS}$. The pass voltage $V_{PASS}$ may have a level lower than the program voltage $V_{PGM}$. For convenience of description, the voltages of the first and second side channels CH_1 and CH_2 are boosted to the first boosting voltage $V_{BSa}$, but alternatively, the boosted voltages of the first and second side channels CH_1 and CH_2 may be different from each other. The first interval may be referred to as a boosting interval for boosting the voltages of the first and second side channels CH_1 and CH_2.

In example embodiments, a voltage level of the program voltage $V_{PGM}$ may be higher than 10V.

The HCI program controller 114 may control the switching voltage $V_{SW}$ of the same level as the switching voltage $V_{SW}$ provided during the first interval to be applied to the switching word line SW_WL, i.e., the word line WL<K+1>, connected to the switching memory cell SW_MC, i.e., the memory cell $MC_{K+1}$, during the second interval. For example, at the beginning of the second interval, a flow of charges between the first side channel CH_1 and the second side channel CH_2 may be blocked through the switching memory cell SW_MC, i.e., the memory cell $MC_{K+1}$, and the channel of the selected cell string Sel_CSTR may be divided into the first side channel CH_1 and the second side channel CH_2.

During the second interval, the HCI program controller 114 may control the string select line voltage $V_{SSL}$ of a certain voltage level (or a high voltage level) to be applied to the string select line SSL connected to the string selection transistor SST, and control the ground select line voltage $V_{GSL}$ of the ground voltage level like the first interval to be applied to the ground selection line GSL connected to the ground selection transistor GST, thereby blocking a flow of charges between the common source line CSL and the second side channel CH_2 by the ground selection transistor GST. In order to further thoroughly block the flow of charges between the common source line CSL and the second side channel CH_2, a common source line voltage of a certain positive voltage level may be applied to the common source line CSL, or the common source line CSL may be floated. The string selection transistor SST may be turned on and the selected cell string Sel_CSTR may be coupled to the selected bit line Sel_BL<1> during the second interval. Accordingly, charges of the first side channel CH_1 may escape through a first charge flow FL_1 in a direction of the selected bit line Sel_BL<1> to which a ground voltage is applied, and thus the boosted voltage $V_{BSa}$ of the first side channel CH_1 may drop VD to a drop voltage $V_{DROP}$. According to an embodiment, the drop voltage $V_{DROP}$ may have a voltage level close to the ground voltage, but alternatively, may have a lowest voltage level that is enough to ideally perform the HCI program operation. At the beginning of the second interval, the ground selection transistor GST is still turned off, and the voltage of the second side channel CH_2 may maintain the first boosting voltage $V_{BSa}$ by the switching memory cell SW_MC, i.e., the memory cell $MC_{K-1}$. Accordingly, a difference $V_{GAPa}$ may be generated between the voltages of the first and second side channels CH_1 and CH_2, and accordingly, a hot carrier may be generated. The HCI program controller 114 may control the program voltage $V_{PGM}$ of a voltage level higher than the pass voltage $V_{PASS}$ to be applied to the selected word line Sel_WL, i.e., the word line WL<k>, during the second interval, such that the generated hot carrier is injected into the selected memory cell Sel_MC, i.e., the memory cell $MC_k$, connected to the selected word line Sel_WL, i.e., the word line WL<k>. According to an embodiment, the program voltage $V_{PGM}$ applied to the selected word line Sel_WL, i.e., the word line WL<k>, may have a voltage level lower than a general program voltage using only F-N tunneling, as will be described below. The HCI program operation may be defined as an operation of programming the selected memory cell Sel_MC, i.e., the memory cell $MC_k$, when the hot carrier is injected into the selected memory cell Sel_MC, i.e., the memory cell $MC_k$, as such. The second interval may be referred to as a program interval with respect to the selected memory cell Sel_MC, i.e., the memory cell $MC_k$.

As such, a memory device according to an embodiment controls the HCI program operation by changing the voltage level of the string select line voltage $V_{SSL}$ applied to the string select line SSL to turn on or off the string selection transistor connected to the string select line SSL. Accordingly, overhead of the memory cell may be reduced compared to when the HCI program operation is controlled by changing a level of a voltage applied to another line, and thus an overall program performance of the memory device may be increased.

Referring to FIG. 7B, the HCI program controller 114 may control the program voltage $V_{PGM}$ of a first level to be applied to the selected word line WL<k> during the first interval and control the program voltage $V_{PGM}$ of a second level higher than the first level to be applied to the selected word line WL<k> during the second interval, in comparison with FIG. 7A. According to an embodiment, the program voltage $V_{PGM}$ of the first interval may be controlled to be lower than the program voltage $V_{PGM}$ of the first interval of FIG. 7A so as to reduce power consumption during channel boosting.

Referring to FIG. 7C, the HCI program controller 114 may control the bit line selection voltage $V_{BL}$(PGM) having a level lower than the inhibit voltage $V_{BL}$(Inhibit) and higher than a ground voltage to be applied to the selected bit line Sel_BL<1> to be programmed during the first interval, in comparison with FIG. 7A. And then, the HCI program controller 114 may control the bit line selection voltage $V_{BL}$(PGM) of the ground voltage level to be applied to the selected bit line Sel_BL<1> to be programmed during the second interval. As such, by instantaneously changing the level of the selected bit line Sel_BL<1> to the ground level during the second interval, the first charge flow FL_1 from the first side channel CH_1 may be larger than the first charge flow FL_1 in FIG. 7A, and as a result, the HCI program operation may be effectively performed.

Figure 8:
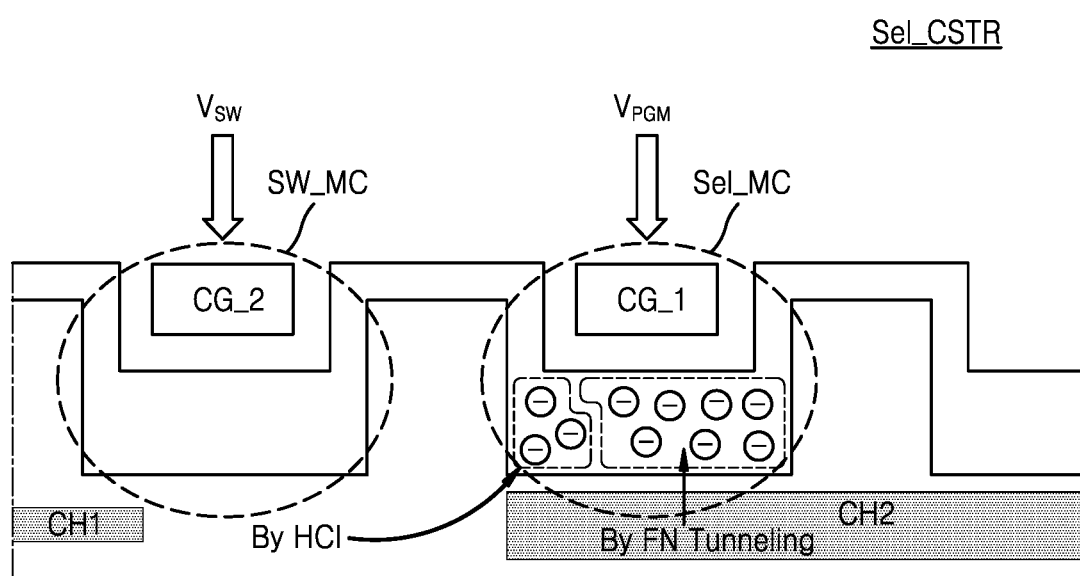
FIG. 8 is a diagram of a portion of a selected cell string for describing a program operation of a memory device, according to example embodiments.

FIG. 8 is a diagram of a portion of a selected cell string for describing a program operation of a memory device, according to example embodiments.

Referring to FIG. 8, the selected cell string Sel_CSTR may include the selected memory cell Sel_MC and the switching memory cell SW_MC. As described above with reference to FIGS. 6 and 7A through 7C, the first and second side channels CH_1 and CH_2 are obtained by the switching voltage $V_{SW}$ applied to a control gate CG_2 of the switching memory cell SW_MC, and then a difference between the voltages of the first and second side channels CH_1 and CH_2 may be generated. Accordingly, a hot carrier may be generated, and may be injected into the selected memory cell Sel_MC by the program voltage $V_{PGM}$ of a high voltage level applied to a control gate CG_1 of the selected memory cell Sel_MC. Also, electrons may be introduced to the selected memory cell Sel_MC through F-N tunneling operation, according to the program voltage $V_{PGM}$ applied to the control gate CG_1 of the selected memory cell Sel_MC. For example, the program operation of the memory device according to an embodiment may program certain data on the selected memory cell Sel_MC by using HCI operation and F-N tunneling operation. Accordingly, the memory device according to an embodiment may decrease the level of the program voltage $V_{PGM}$ needed to prepare the selected memory cell Sel_MC to a desired program state, and by applying the reduced voltage level of the HCI program operation, thereby reducing overhead of a periphery circuit of the memory device and as a result, increasing an overall program performance of the memory device.

Figure 9:
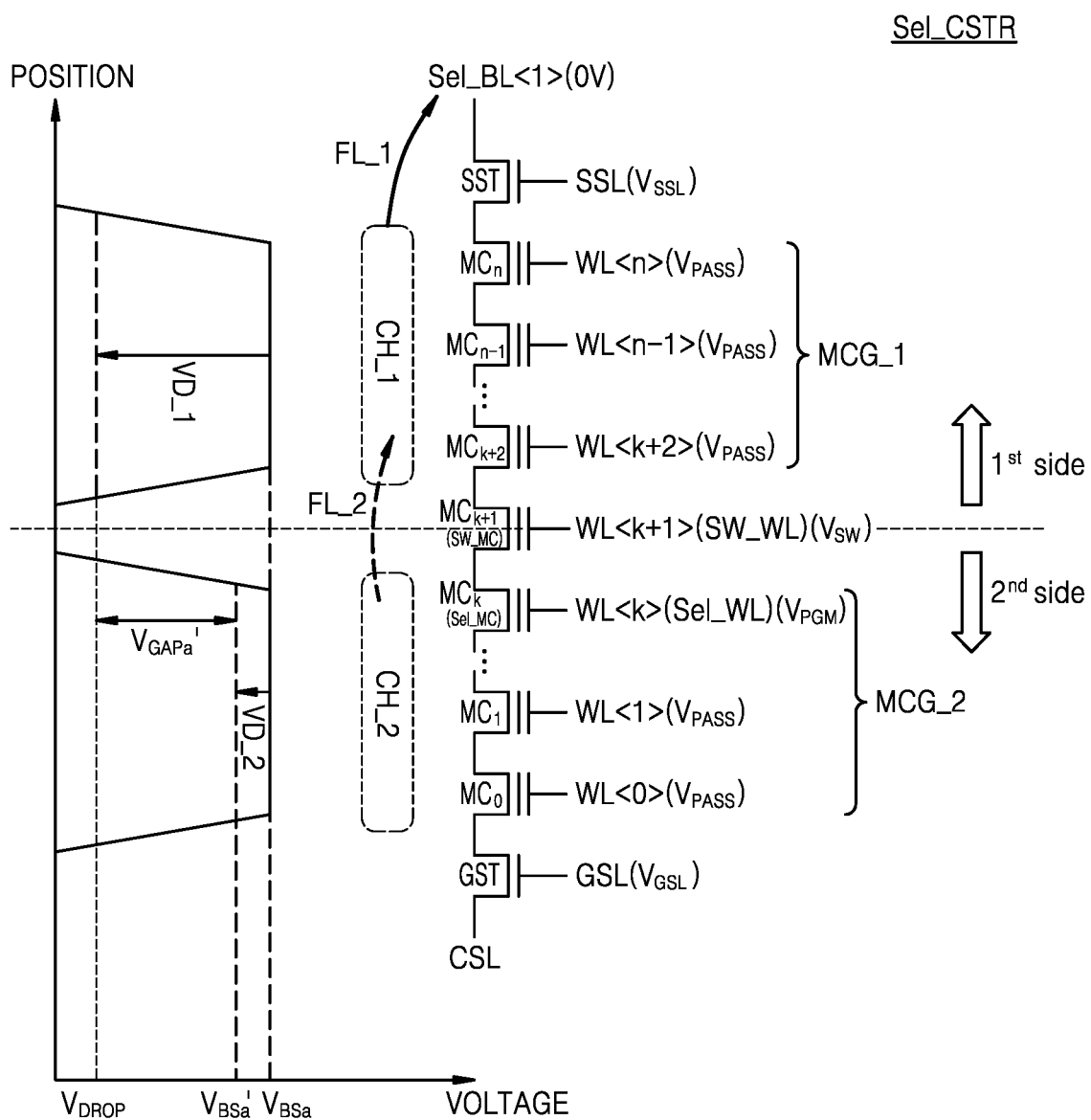
FIG. 9 illustrates a selected cell string and a channel voltage of the selected cell string to describe an HCI program operation, according to another example embodiment.
Figure 10A:
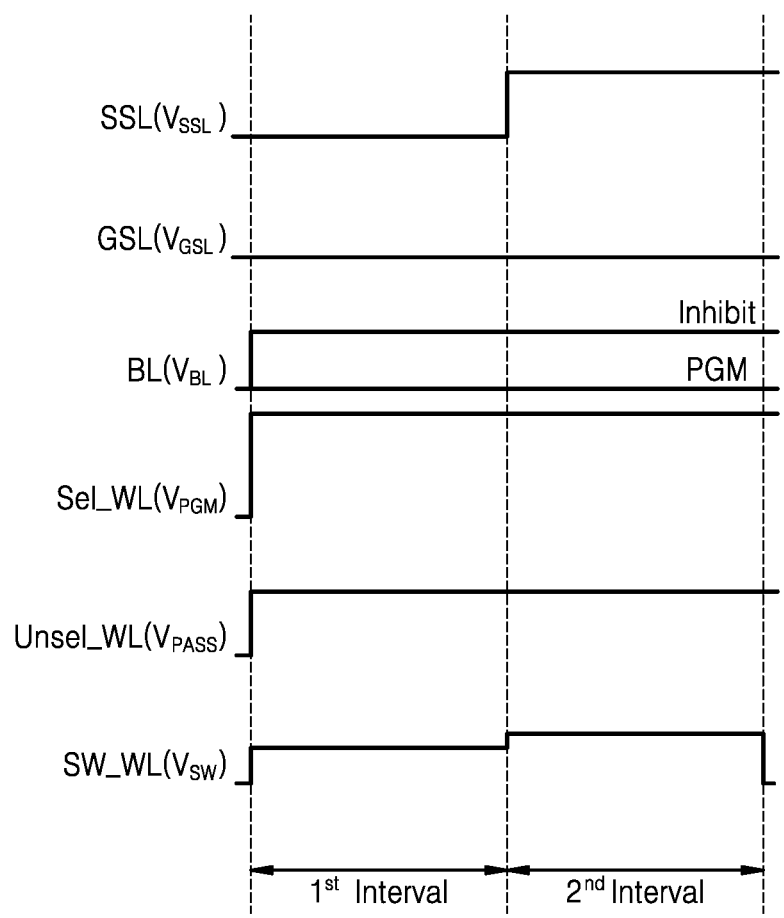
FIGS. 10A through 11 are timing diagrams for describing HCI program operations according to example embodiments.
Figure 10B:
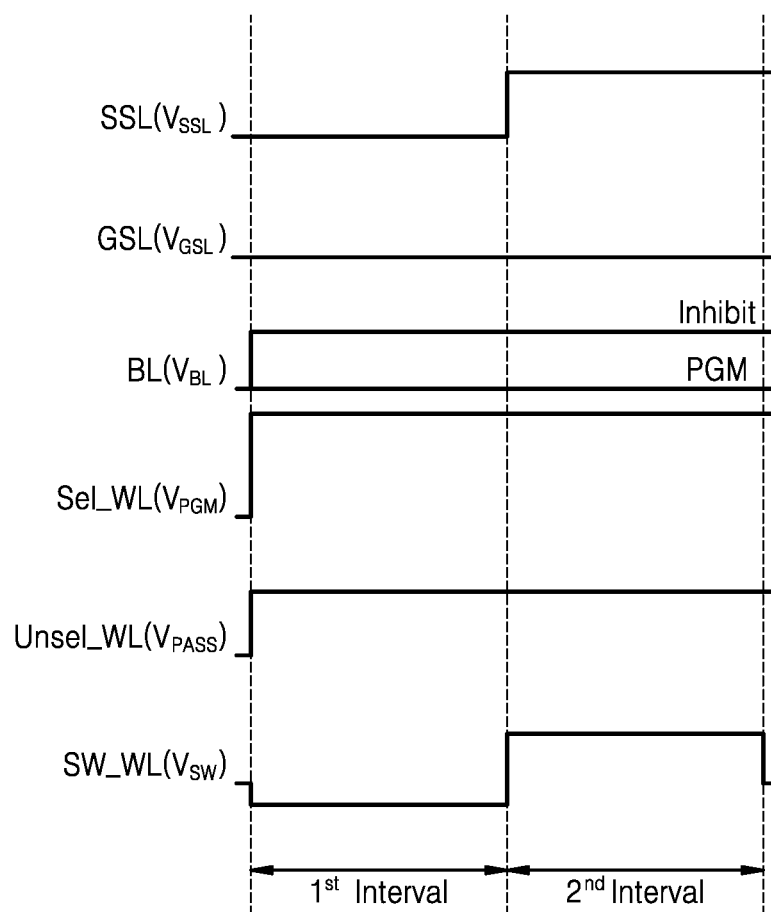
Figure 11:
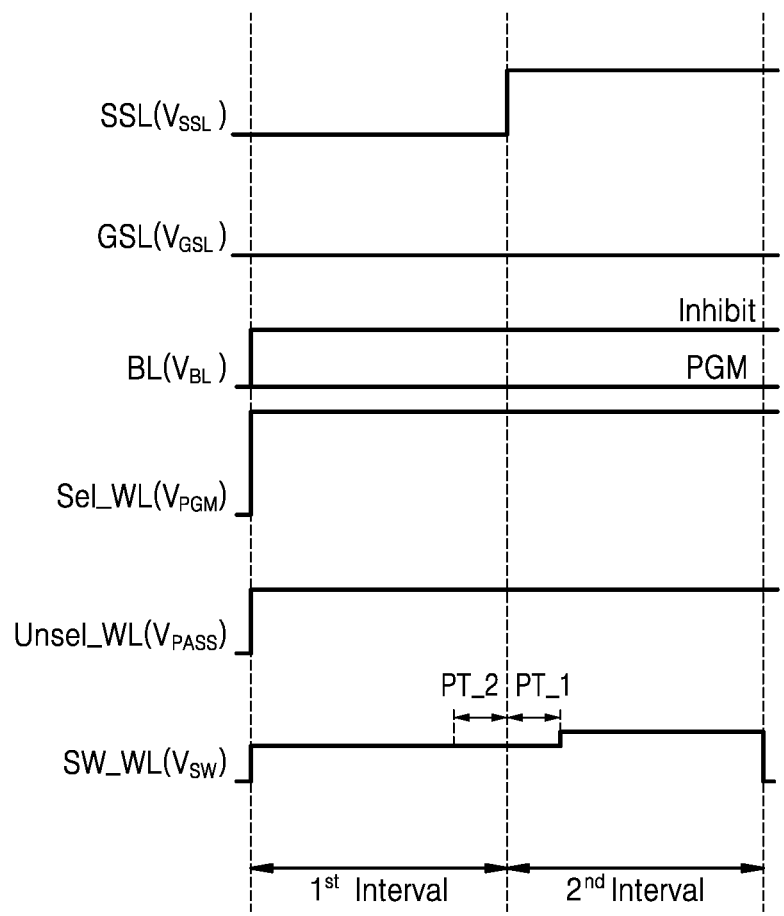

FIG. 9 illustrates the selected cell string Sel_CSTR and a channel voltage of the selected cell string Sel_CSTR to describe an HCI program operation, according to other example embodiments, and FIGS. 10A, 10B, and 11 are timing diagrams for describing HCI program operations according to example embodiments.

Referring to FIG. 9, a structure of the selected cell string Sel_CSTR may be the same as that of FIG. 6, and thus descriptions thereof are not provided again. Further referring to FIGS. 2 and 10A, the HCI program controller 114 may control a level of the switching voltage $V_{SW}$ applied to the switching word line SW_WL during the second interval to be different from a level of the switching voltage $V_{SW}$ applied to the switching word line SW_WL during the first interval, in comparison with FIG. 7A. According to an embodiment, the level of the switching voltage $V_{SW}$ in the second interval may be higher than the level of the switching voltage $V_{SW}$ in the first interval. Also, the switching voltage $V_{SW}$ may have a positive level in the first and second intervals. Referring back to FIG. 9, when the level of the switching voltage $V_{SW}$ is changed to be higher in the second interval, a current flow FL_2 may be generated from the second side channel CH_2 to the first side channel CH_1. Accordingly, charges of the second side channel CH_2 boosted to the first boosting voltage $V_{BSa}$ in the first interval may escape in a direction of the first side channel CH_1 through the second current flow FL_2, and thus a voltage of the second side channel CH_2 may drop by a certain voltage VD_2 to a second boosting voltage $V_{BSa}'$. Also, charges of the first side channel CH_1 boosted to the first boosting voltage $V_{BSa}$ may escape in a direction of the selected bit line Sel_BL<1> through the first charge flow FL_1, and thus a voltage of the first side channel CH_1 may drop by a certain voltage VD_1 to the drop voltage $V_{DROP}$. The second current flow FL_2 may be small enough to perform the HCI program operation on the selected memory cell Sel_MC, i.e., the memory cell $MC_k$, in the second interval.

A difference $V_{GAPa}'$ between the voltages of the first and second side channels CH_1 and CH_2 of FIG. 9 may have a lower level than the difference $V_{GAPa}$ between the voltages of the first and second side channels CH_1 and CH_2 of FIG. 6. The HCI program controller 114 may adjust the amount of electrons injected to the selected memory cell Sel_MC, i.e., the memory cell $MC_k$, according to the HCI program operation by adjusting the difference $V_{GAPa}'$ of the first and second side channels CH_1 and CH_2, which is an important factor for generating a hot carrier. For example, when the program voltage $V_{PGM}$ applied to the selected word line Sel_WL, i.e., the word line WL<k>, of FIG. 9 is the same as the program voltage $V_{PGM}$ applied to the selected word line Sel_WL, i.e, the word line WL<k>, of FIG. 6, the amount of electrons injected into the selected memory cell Sel_MC according to the HCI program operation in FIG. 9 may be smaller than that injected into the selected memory cell Sel_MC according to the HCI program operation in FIG. 6. However, this is only an example, and various results may be derived via different elements.

Referring to FIG. 10B, the HCI program controller 114 may control the switching voltage $V_{SW}$ applied to the switching word line SW_WL during the first interval to have a certain negative voltage level, in comparison with FIG. 10A. For example, the first and second side channels CH_1 and CH_2 may be further thoroughly blocked through the switching memory cell SW_MC by applying the switching voltage $V_{SW}$ of a negative voltage level to a control gate of the switching memory cell SW_MC connected to the switching word line SW_WL during the first interval.

Referring to FIG. 11, the HCI program controller 114 may control a timing when the level of the switching voltage $V_{SW}$ is transited in the second interval to be different from a timing when the level of the string select line voltage $V_{SSL}$ is transited, in comparison with FIG. 10. According to an embodiment, the HCI program controller 114 may control the level of the switching voltage $V_{SW}$ to be transited after a first preset time PT_1 from the timing when the level of the string select line voltage $V_{SSL}$ is transited in the second interval, or before a second preset time PT_2 when the level of the string select line voltage $V_{SSL}$ is transited in the second interval. The HCI program controller 114 may variously set the first and second preset times PT_1 and PT_2 according to a desired amount of electrons to be injected into the selected memory cell Sel_MC, i.e., the memory cell $MC_k$, by the HCI program operation. However, this is only an example, and alternatively, the HCI program controller 114 may control the level of the string select line voltage $V_{SSL}$ to be transited after a certain time from the timing when the level of the switching voltage $V_{SW}$ is transited in the second interval.

As such, the memory device 100 according to an embodiment may control the level of the switching voltage $V_{SW}$ to be transited while performing the HCI program operation, and in addition, may control the timing when the level of the switching voltage $V_{SW}$ is transited and the timing when the level of the string select line voltage $V_{SSL}$ is transited to be different from each other, and thus the HCI program operation may be efficiently performed according to an operation state of the memory device 100.

Figure 12A:
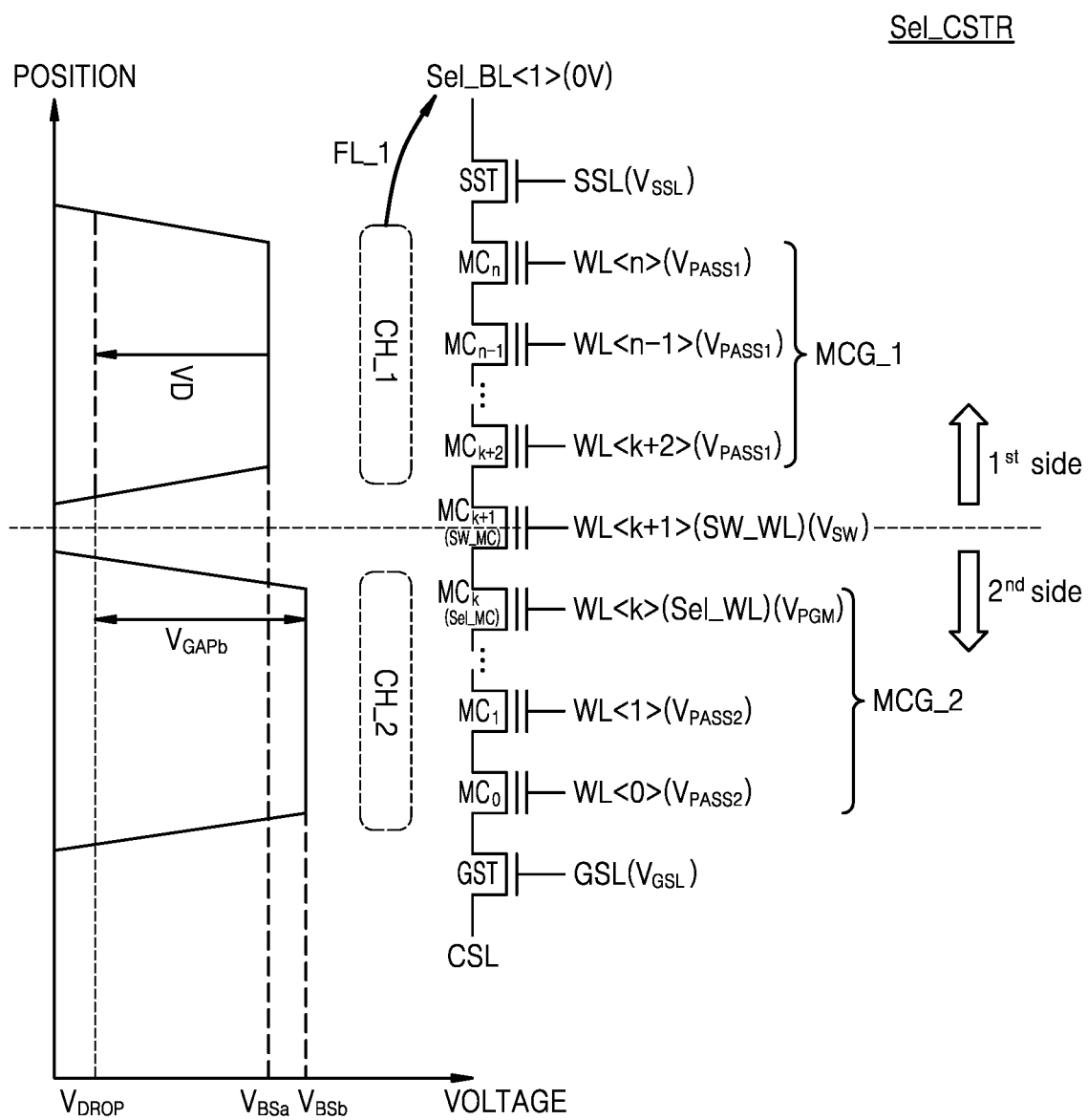
FIGS. 12A and 12B are diagrams for describing HCI program operations according to example embodiments.
Figure 12B:
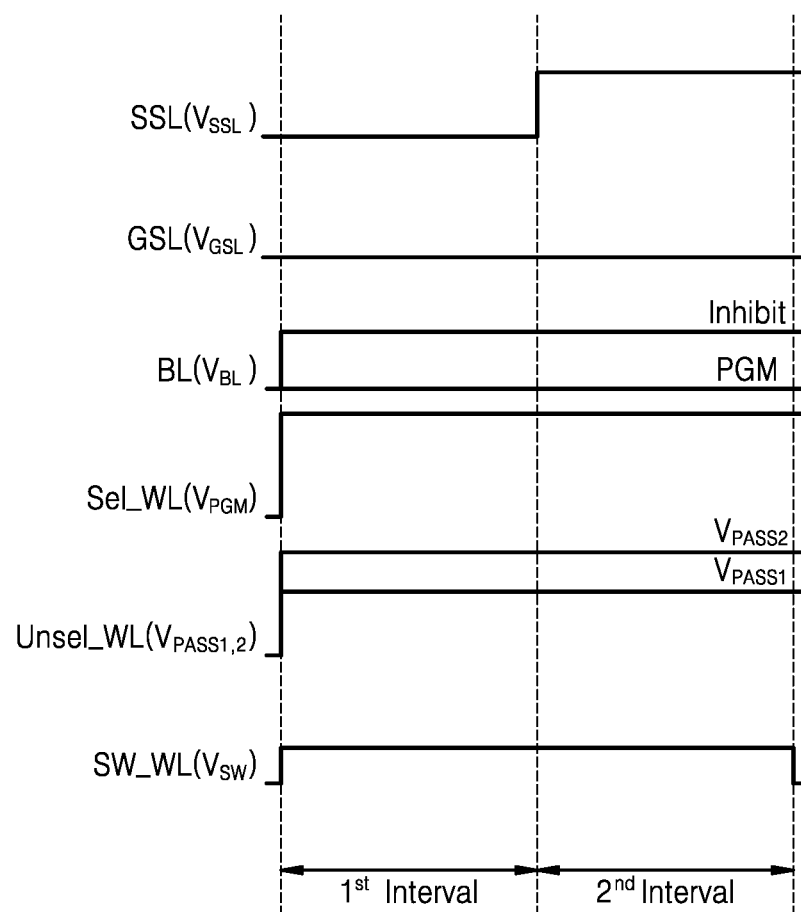

FIGS. 12A and 12B are diagrams for describing HCI program operations according to example embodiments.

Referring to FIG. 12A, a structure of the selected cell string Sel_CSTR is the same as that of FIG. 6, and thus descriptions thereof are not provided again. Further referring to FIGS. 2 and 12B, the HCI program controller 114 may control a first pass voltage $V_{PASS1}$ to be applied to the unselected word lines WL<K+2> through WL<n> connected to the memory cells of the first memory cell group MCG_1, and control a second pass voltage $V_{PASS2}$ to be applied to the unselected word lines WL<0> through WL<K−1> connected to the memory cells of the second memory cell group MCG_2 in the first and second intervals, in comparison with FIG. 7. According to an embodiment, a level of the second pass voltage $V_{PASS2}$ may be higher than a level of the first pass voltage $V_{PASS1}$. In FIG. 12B, the level of the first pass voltage $V_{PASS1}$ may be the same as the level of the pass voltage $V_{PASS}$ of FIG. 7.

Referring back to FIG. 12B, the voltage of the second side channel CH_2 may be boosted to a third boosting voltage $V_{BSb}$ during the first interval. Accordingly, a difference $V_{GAPb}$ between the voltages of the first and second side channels CH_1 and CH_2 may be higher than the difference $V_{GAPa}$ of FIG. 6. Accordingly, when the difference $V_{GAPb}$ increases, the amount of hot carriers generated in FIG. 12B may be larger than that of FIG. 6, and thus the amount of electrons injected to the selected memory cell Sel_MC, i.e., the memory cell $MC_k$, according to the HCI program operation may be affected. The HCI program controller 114 according to an embodiment may control the levels of the first and second pass voltages $V_{PASS1}$ and $V_{PASS2}$ to be different from each other, thereby adjusting the amount of electrons injected to the selected memory cell Sel_MC, i.e., the memory cell $MC_k$, according to the HCI program operation.

Figure 13A:
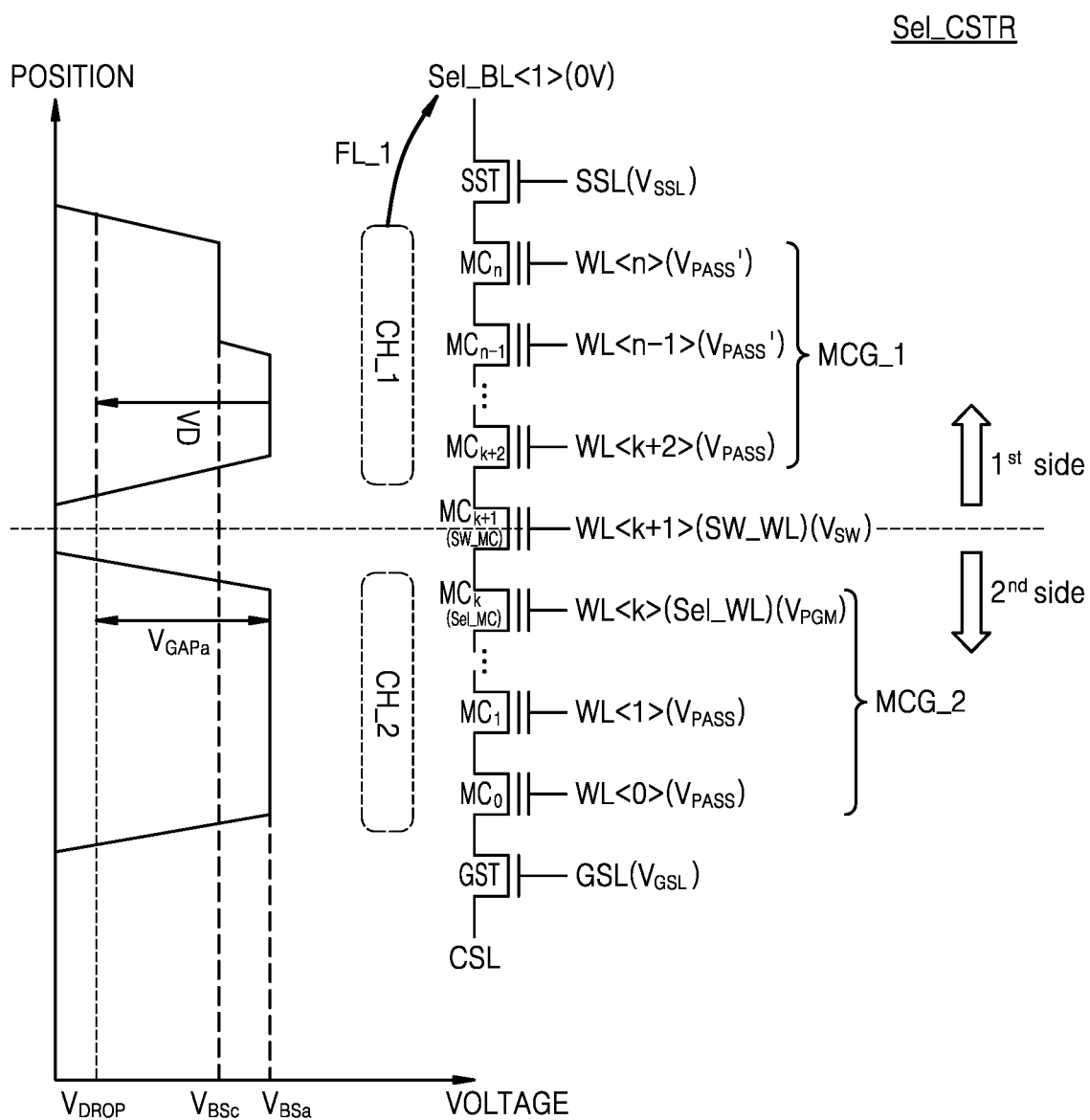
FIGS. 13A and 13B are diagrams for describing HCI program operations according to example embodiments.
Figure 13B:
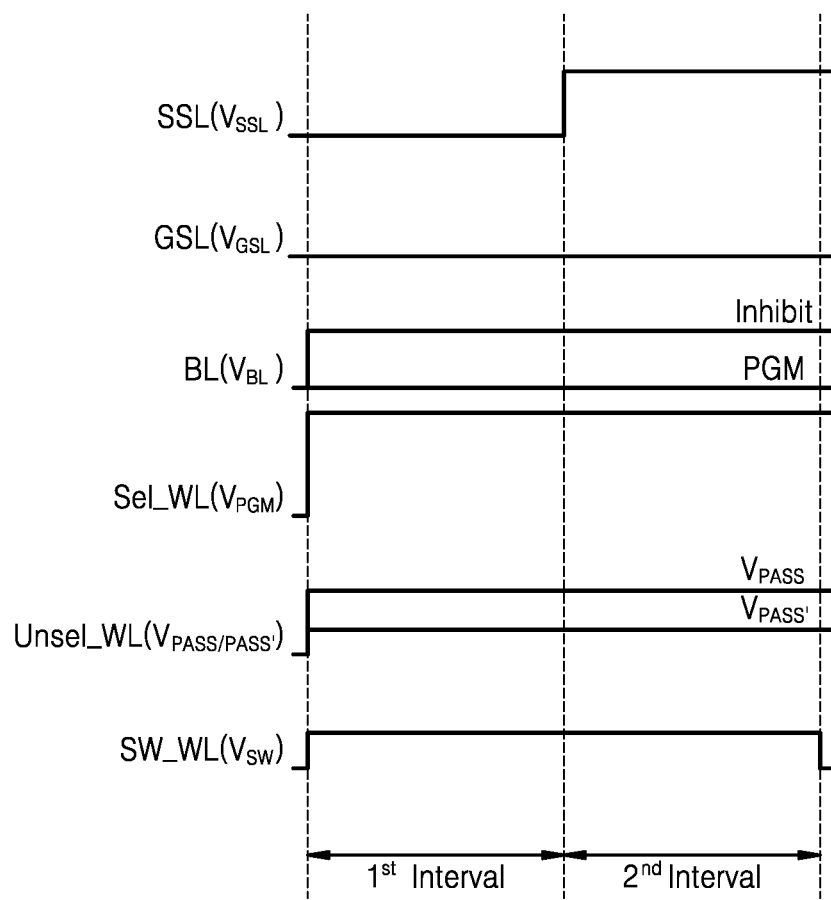

FIGS. 13A and 13B are diagrams for describing HCI program operations according to example embodiments.

Referring to FIG. 13A, a structure of the selected cell string Sel_CSTR is the same as that of FIG. 6, and thus descriptions thereof are not provided again. Further referring to FIGS. 2 and 13B, the HCI program controller 114 may control a third pass voltage $V_{PASS}'$ of a level lower than the pass voltage $V_{PASS}$ applied to the unselected word lines WL<0> through WL<k−1> and WL<k+2> through WL<n−2> to be applied to the unselected word lines WL<n−1> and WL<n> adjacent to the string select line SSL during the first and second intervals, in comparison with FIG. 7. For example, the third pass voltage $V_{PASS}'$ may be applied to some memory cells, i.e., the memory cells $MC_{n-1}$ and $MC_n$ adjacent to the string selection transistor SST from among the memory cells $MC_{k+2}$ through $MC_n$ included in the first memory cell group MCG_1.

Referring back to FIG. 13A, a voltage of a channel formed in the memory cells $MC_{n-1}$ and $MC_n$ of the first memory cell group MCG_1 during the first interval may be boosted to a fourth boosting voltage $V_{BSc}$ of a level lower than the first boosting voltage $V_{BSa}$. An undesired hot carrier is generated due to a large voltage difference between voltage of the selected bit line Sel_BL<1> and voltage of channel of the memory cells $MC_{n-1}$ and $MC_n$ at a moment when the channel of the memory cells $MC_{n-1}$ and $MC_n$ of the first memory cell group MCG_1 is electrically connected to the selected bit line Sel_BL<1> to which a ground voltage is applied at the beginning of the second interval, and thus the undesired hot carrier may become a disturbance during a program operation. For example, the HCI program controller 114 may apply the third pass voltage $V_{PASS}'$ of a level lower than the pass voltage $V_{PASS}$ to the memory cells $MC_{n-1}$ and $MC_n$ so as to reduce the voltage difference between the voltage of the selected bit line Sel_BL<1> and the voltage of channel of the memory cells $MC_{n-1}$ and $MC_n$ generated at the beginning of the second interval, thereby preventing the disturbance.

The unselected word lines WL<n−1> and WL<n> to which the third pass voltage $V_{PASS}'$ of FIG. 13A is applied are only examples, and alternatively, the third pass voltage $V_{PASS}'$ may be applied to more unselected word lines adjacent to the string select line SSL, or the third pass voltage $V_{PASS}'$ may be applied to all unselect word lines WL<k+2> through WL<n> connected to the memory cells $MC_{k+2}$ through $MC_n$ of the first memory cell group MCG_1. Alternatively, the third pass voltage $V_{PASS}'$ may be applied only to the unselected word line WL<n> most adjacent to the string select line SSL.

Figure 14A:
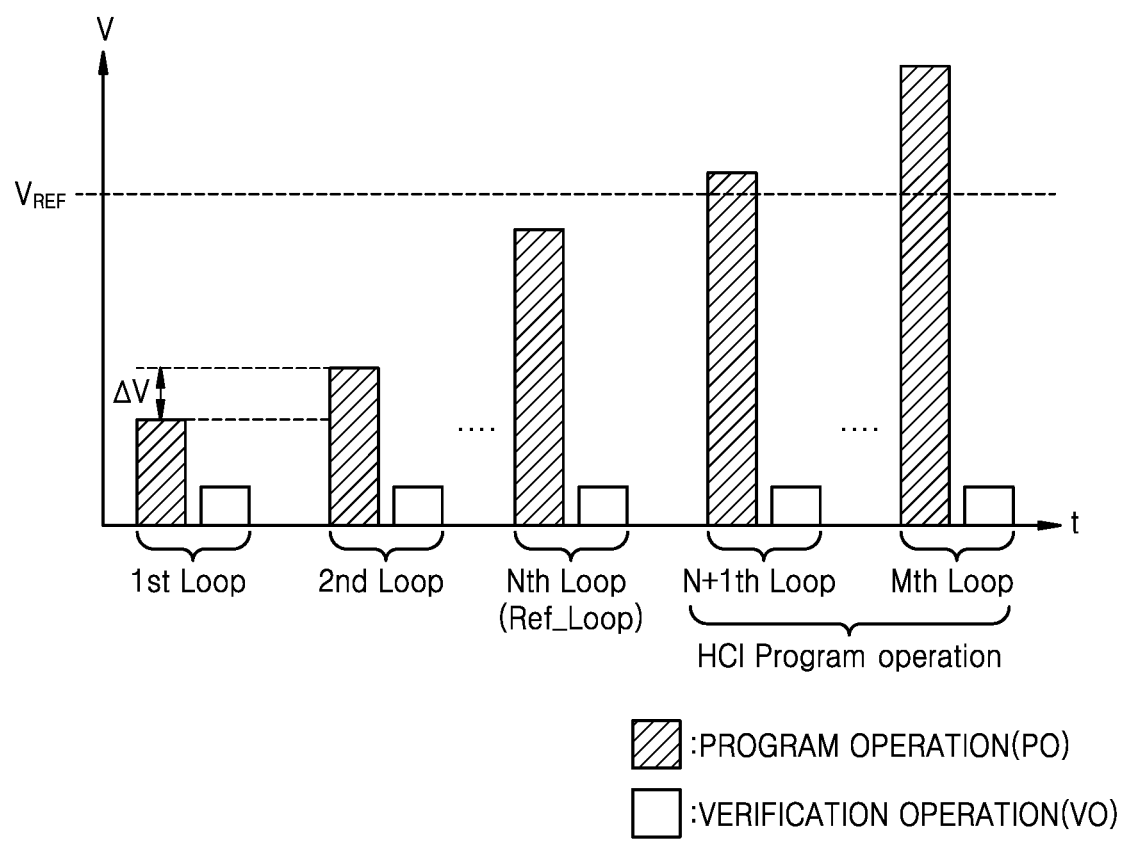

FIGS. 14A and 14B are diagrams for describing a method of selecting a program loop including an HCI program operation, according to example embodiments.

Referring to FIGS. 2 and 14A, the control logic 110 may perform a plurality of program loops, i.e., first through $M^{th}$ program loops, in order to program selected memory cells of the memory cell array 160 to a certain program state. For example, the control logic 110 may perform a program operation PO of providing a program voltage of a certain level to the selected memory cells and a verification operation VO of verifying a program state by providing a verification voltage, as the first program loop, and then perform the program operation PO of providing the program voltage of a level higher than that in the first program loop by a step voltage ΔV to the selected memory cells and the verification operation VO of verifying a program state by providing the verification voltage, as the second program loop.

The HCI program controller 114 may control the HCI program operation while performing program loops selected from among the first through $M^{th}$ program loops. According to an embodiment, the HCI program controller 114 may set an $N^{th}$ program loop performed at the $N^{th}$ order in a time sequence from among the first through $M^{th}$ program loops, as a reference program loop Ref_Loop, and control the HCI program operation while performing the N+1$^{th}$ program loop through the $M^{th}$ program loop performed after the $N^{th}$ program loop.

According to an embodiment, the HCI program controller 114 may select program loops using a program voltage of a level of a reference voltage $V_{REF}$ of higher from among the first through $M^{th}$ program loops, and control the HCI program operation while performing the selected program loops. The program loops using the program voltage of the level of the reference voltage $V_{REF}$ or higher may include the N+1$^{th}$ through $M^{th}$ program loops, and the HCI program controller 114 may control the HCI program operation while performing the N+1$^{th}$ through $M^{th}$ program loops. The program voltage in the N+1$^{th}$ through $M^{th}$ program loops may be reduced by HCI program operation. For example, a program voltage of the N+1$^{th}$ program loop may be lower than a program voltage of the $N^{th}$ program loop.

Further referring to FIG. 14B, a program voltage used in each of the first through $M^{th}$ program loops may be generated in consideration of an operating temperature of the memory device 100 during a program operation of the memory device 100. As shown in a lookup table LUT, an offset is set according to the operating temperature of the memory device 100 during the program operation of the memory device 100, and the voltage generator 140 may generate the program voltage with reference to the lookup table LUT. Accordingly, whether the HCI program operation is performed varies according to the operating temperature of the memory device 100 even with respect to the same program loop.

Figure 15:
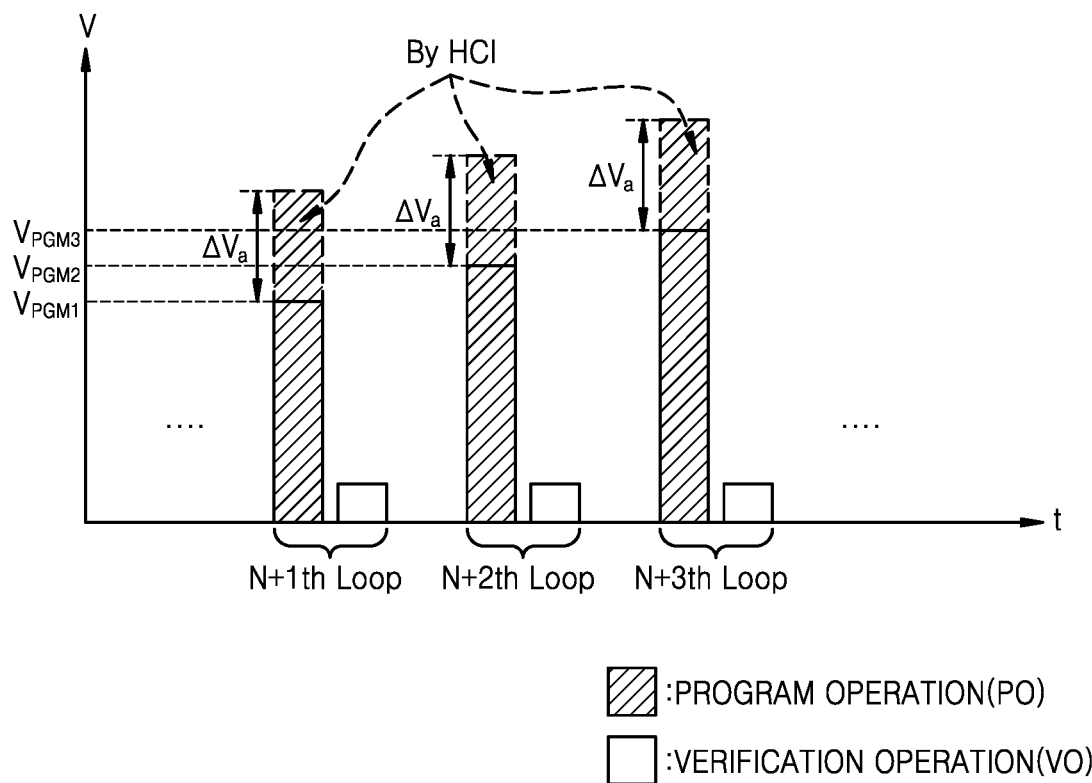
FIGS. 15 and 16 are diagrams for describing program methods according to example embodiments.
Figure 16:
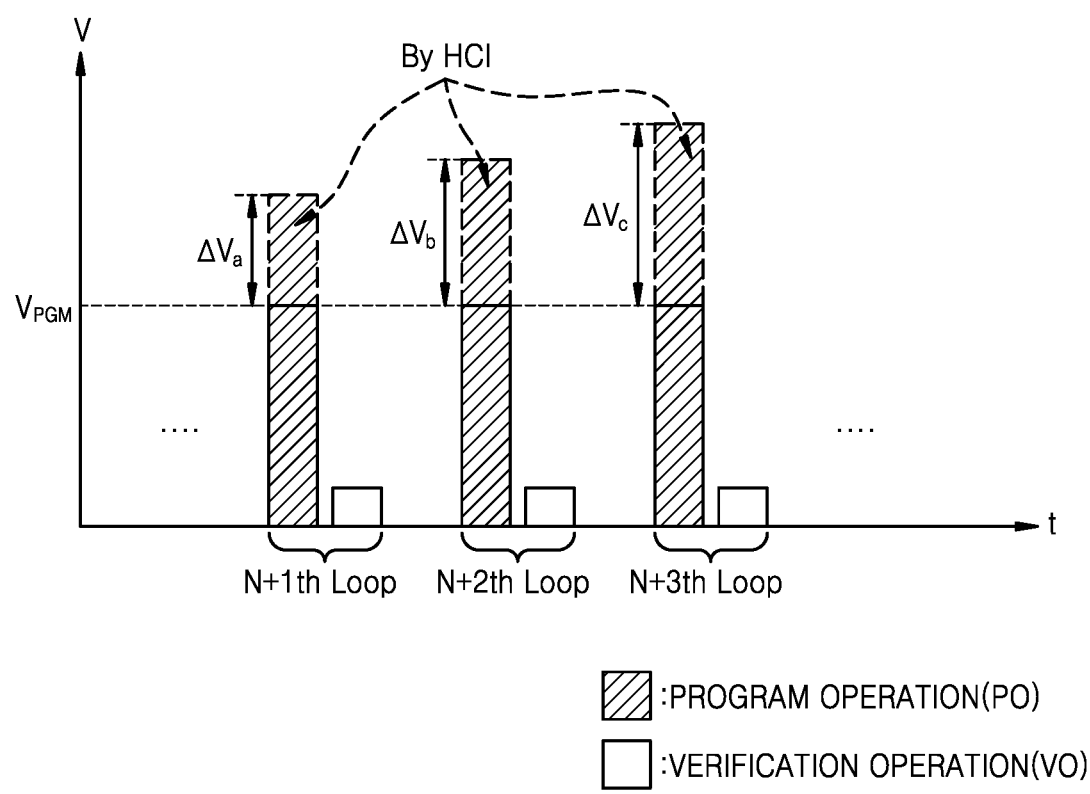

FIGS. 15 and 16 are diagrams for describing program methods according to example embodiments.

Referring to FIG. 15, levels of program voltages $V_{PGM1}$ through $V_{PGM3}$ respectively used while performing the N+1$^{th}$ through N+3$^{th}$ program loops may be uniformly reduced by a first voltage $\Delta V_a$ by controlling an HCI program operation while performing the N+1$^{th}$ through N+3$^{th}$ program loops. For example, when the levels of the program voltages $V_{PGM1}$ through $V_{PGM3}$ are reduced, insufficient electrons may be compensated for through the HCI program operation so as to prepare a target program state of a selected memory cell. According to an embodiment, in order to uniformly reduce the levels of the program voltages $V_{PGM1}$ through $V_{PGM3}$ respectively used while performing N+1$^{th}$ through N+3$^{th}$ program loops to the first voltage $\Delta V_a$, an HCI program controller may uniformly adjust the amount of electrons injected to the selected memory cell according to the HCI program operation while performing the N+1$^{th}$ through N+3$^{th}$ program loops.

Referring to FIG. 16, a level of the program voltage $V_{PGM}$ used while performing the N+1$^{th}$ through N+3$^{th}$ program loops may be reduced respectively by first through third voltages $\Delta V_a$ through $\Delta V_c$ by controlling the HCI program operation while performing the N+1$^{th}$ through N+3$^{th}$ program loops, in comparison with FIG. 15. For example, the level of the program voltage $V_{PGM}$ required while performing the N+1$^{th}$ through N+3$^{th}$ program loops may be set to be the same, and the HCI program controller may control the amount of electrons injected to the selected memory cell according to the HCI program operation to increase while performing the N+1$^{th}$ through N+3$^{th}$ program loops. Accordingly, the level of the program voltage $V_{PGM}$ used while performing program loops after a certain program loop, for example, the $N^{th}$ program loop, is uniformly maintained, and thus overhead of a periphery circuit including a voltage generator of a memory device may be reduced, thereby preventing a disturbance related to an erase operation generated by a very high program voltage.

Figure 17A:
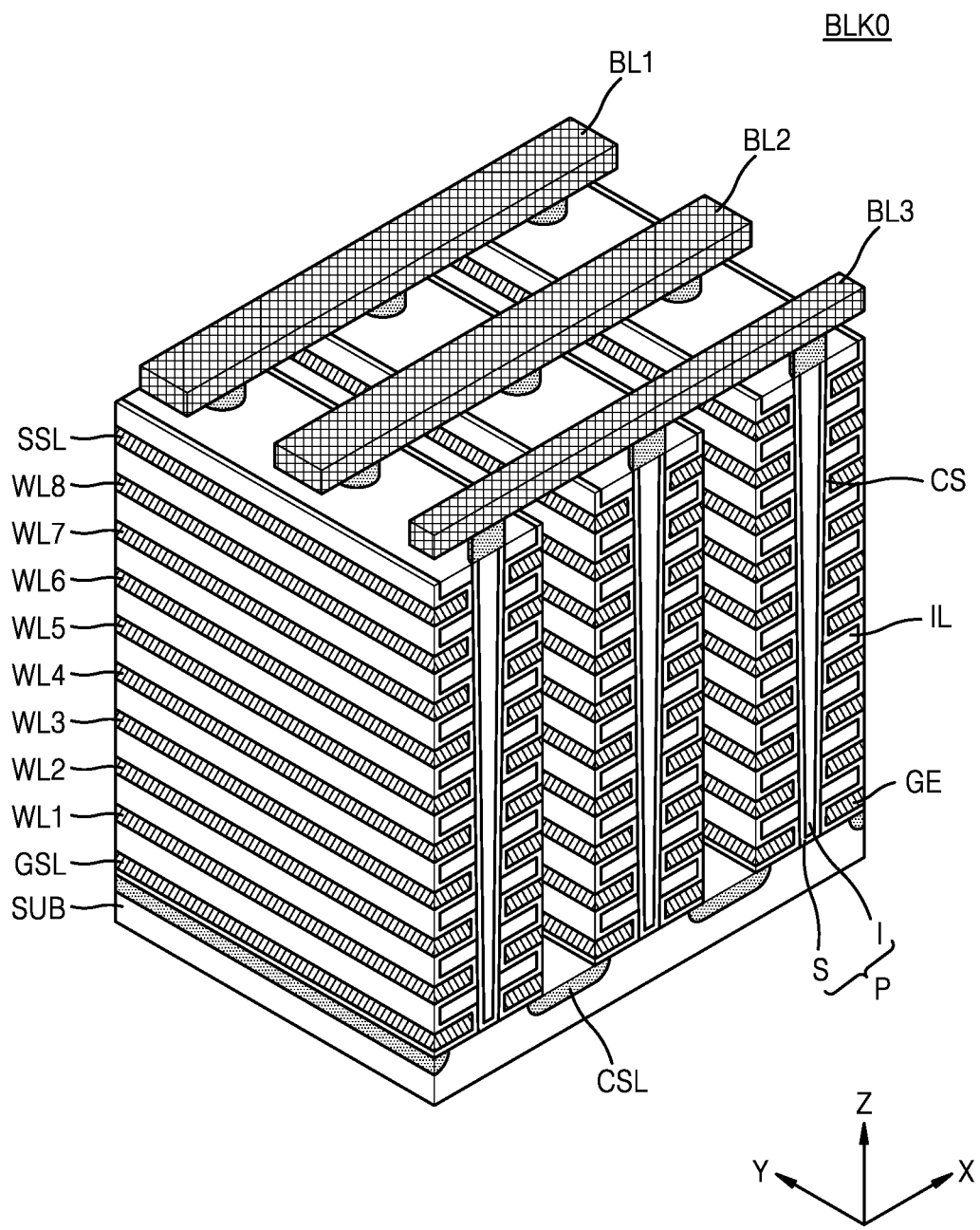
FIG. 17A is a perspective view of a first block that is one of blocks of FIG. 3, according to example embodiments.
Figure 17B:
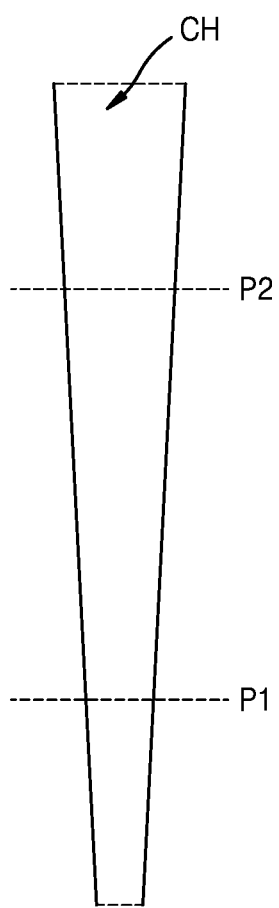
FIG. 17B is a diagram for describing a characteristic of a channel of FIG. 17A according to example embodiments.
Figure 17C:
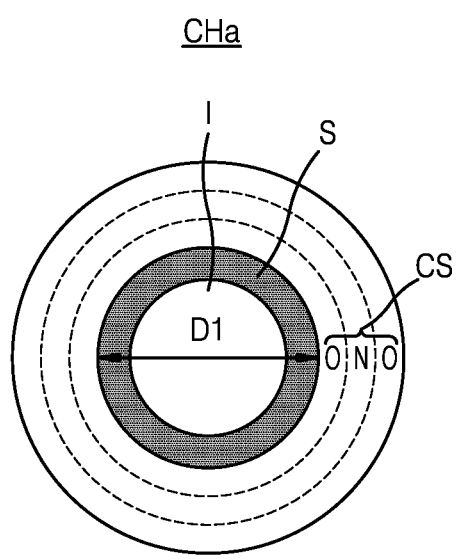
FIGS. 17C and 17D illustrate cross-sections of a cell string of FIG. 5, according to example embodiments.
Figure 17D:
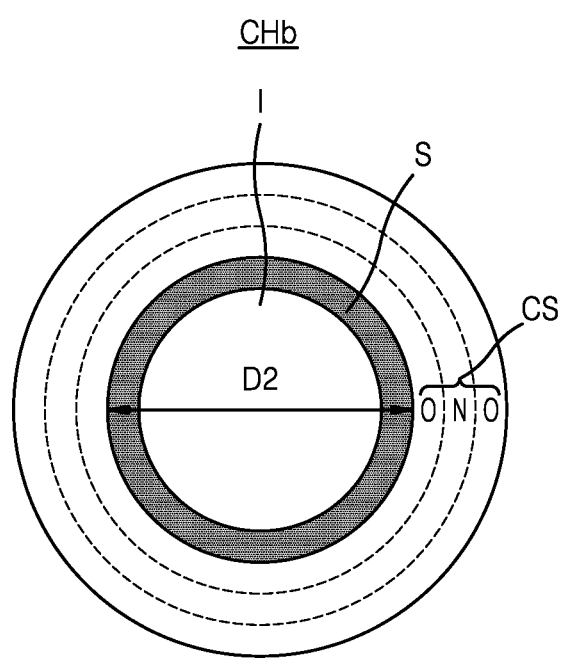

FIG. 17A is a perspective view of the memory block BLK0 that is one of the memory blocks BLK0 through BLKa−1 of FIG. 3, according to example embodiments, FIG. 17B is a diagram for describing a characteristic of a channel of FIG. 17A, and FIGS. 17C and 17D illustrate cross-sections of a cell string of FIG. 5, according to example embodiments.

Referring to FIG. 17A, the memory block BLK0 is formed in a direction perpendicular to the substrate SUB. In FIG. 17A, the memory block BLK0 includes two select lines, i.e., the ground select line GSL and the string select line SSL, the word lines WL1 through WL8, and the first through third bit lines BL1 through BL3, but the memory block BLK0 may include more or less components than those shown in FIG. 17A. The substrate SUB may be a first conductive type (for example, p-type), and the common source line CSL extending along a first direction (for example, X-direction) and on which a second conductive type (for example, n-type) impurities are doped is provided over the substrate SUB. A plurality of insulating layers IL extending along the first direction are sequentially provided along a third direction (for example, Z-direction) over a region of the substrate SUB between the two adjacent common source lines CSL, wherein the plurality of insulating layers IL are separated by a certain distance along the third direction. For example, the plurality of insulating layers IL may include an insulating material, such as silicon oxide. A plurality of pillars P arranged sequentially along the first direction and penetrating through the plurality of insulating layers IL in the third direction are provided over the region of the substrate SUB between the two adjacent common source lines CSL. For example, the plurality of pillars P may contact the substrate SUB by penetrating the plurality of insulating layers IL. In detail, a surface layer S of the pillar P may include a silicon material of the first conductive type, and operate as a channel region. Meanwhile, an inner layer I of the pillar P may include an insulating material, such as silicon oxide, or an air gap. A charge storage layer CS is provided along exposed surfaces of the insulating layers IL, the pillars P, and the substrate SUB, in the region between the two adjacent common source lines CSL. For example, the charge storage layer CS may have an oxide-nitrideoxide (ONO) structure. Also, a gate electrode GE is provided over an exposed surface of the charge storage layer CS, in the region between the two adjacent common source lines CSL. Drains or drain contacts DR are respectively provided over the plurality of pillars P. For example, the drains or drain contacts DR may include a silicon material on which impurities of the second type are doped. The bit lines BL spaced apart from each other by a certain distance along the first direction and extending in a second direction (for example, Y-direction are provided over the drains or drain contacts DR.

Further referring to FIG. 17B, a channel hole CH of FIG. 17A is shown in detail, and since the channel hole CH is formed by etching partial regions of gate electrodes and insulating layers stacked on a substrate, etching may not be satisfactorily performed when a depth from a surface increases. Accordingly, a diameter of the channel hole CH may decrease towards the substrate.

Further referring to FIG. 17C, a cross-section of a cell string including a first channel hole CHa corresponding to a cross-section of the channel hole CH at a first location P1 of FIG. 17B is illustrated. The first channel hole CHa may include a pillar including the surface layer S and the inner layer I, wherein the charge storage layer CS may be provide on a circumference of the first channel hole CHa and may have an ONO structure.

Further referring to FIG. 17D, a cross-section of a cell string including a second channel hole CHb corresponding to a cross-section of the channel hole CH at a second location P2 of FIG. 17B is illustrated. The second channel hole CHb may include a pillar including the surface layer S and the inner layer I, wherein the charge storage layer CS may be provided on a circumference of the second channel hole CHb and may have an ONO structure. According to an embodiment, characteristics of a memory cell may vary due to a difference between diameters of the first and second channel holes CHa and CHb. For example, in case of a 3D memory device having a gate all around form in which a gate electrode is provided on a circumference of a channel hole, a focusing degree of an electric field formed in a channel region of a gate electrode (for example, the gate electrode GE of FIG. 17A) increases when a diameter of a channel hole decreases. Accordingly, a memory cell having a small channel hole diameter, such as the first channel hole CHa, may have a higher program or erase operation speed than a memory cell having a large channel hole diameter, such as the second channel hole CHb.

For example, since a diameter of a channel hole (for example, the second channel hole CHb) included in a memory cell connected to an upper word line is wider than a channel hole (for example, the first channel hole CHa) included in a memory cell connected to a lower word line, based on adjacency to the first through third bit lines BL1 through BL3 of FIG. 17A, a program operation speed of the memory cell connected to the upper word line may be slower than that of the memory cell connected to the lower word line.

Reasons of different characteristics of memory cells are not limited to a difference between diameters of a channel hole. For example, the characteristics of the memory cells may vary according to a shape of the channel hole or a thickness of a charge storage layer. According to an embodiment, the shape of the channel hole or the thickness of the charge storage layer may vary according to a location of each selected word line.

For example, a thickness and a component ratio of each layer forming a charge storage layer disposed between a gate electrode and a channel region may vary according to a diameter of a channel hole. For example, a deposition area and deposition surface roughness may vary according to the channel hole based on the diameter of the channel hole while the charge storage layer having an ONO structure is deposited, and accordingly, a speed of a deposition gas being deposited by contacting a deposition surface may vary. Here, characteristics of a memory device may be varied according to a difference of a geometric form, such as a thickness of an ONO film. Hereinafter, changes of the characteristics of the memory cell will be described based on the size of the channel hole but there may be other embodiments considering a geometric shape of a memory cell, i.e., the shape of the channel hole or the thickness of the charge storage layer.

As such, a memory cell having a slow program speed requires a very high program voltage in order to complete a program operation. Accordingly, when the memory cell having a slow program speed is programmed, an HCI program operation may be added to decrease a level of a required program voltage, as will be described below.

Figures 18A, 18B:
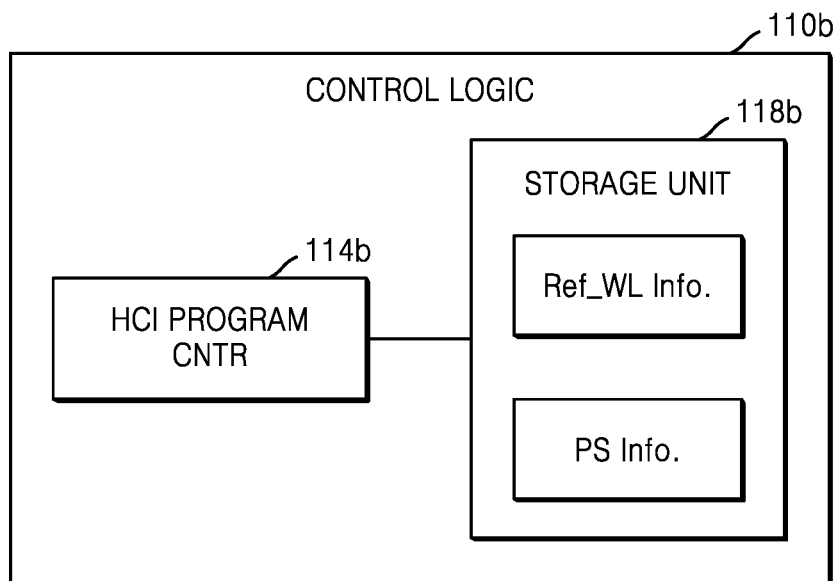
FIGS. 18A and 18B are diagrams for describing an HCI program operation according to memory characteristics, according to example embodiments.

FIGS. 18A and 18B are diagrams for describing an HCI program operation according to memory characteristics, according to example embodiments.

Referring to FIG. 18A, a control logic 110b may include an HCI program controller 114b and a storage unit 118b. The storage unit 118b may store information Ref_WL Info. about a reference word line set according to blocks, and information PS Info. about a program speed of a memory cell connected to word lines according to blocks. According to an embodiment, the HCI program controller 114b may determine at least one program loop from among a plurality of program loops performed on a selected memory cell to include an HCI program operation, by referring to the information Ref_WL Info.

Also, the HCI program controller 114b may store the information PS Info. According to an embodiment, the information PS Info. may vary according to a location of a memory block included in a memory device or according to a location of a word line included in a memory block, as described with reference to FIGS. 17A through 17D.

Further referring to FIG. 18B, the information PS Info. may include an address ADDR_WL of a word line included in each of the memory blocks BLK0 through BLKN, a program speed PS with respect to a memory cell connected to the word lines, and a threshold value THV corresponding to each of the memory blocks BLK0 through BLKN. The threshold value THV may vary according to an operational environment (for example, a temperature condition) when the memory device performs a program operation. According to an embodiment, the HCI program controller 114b may obtain the program speed on the selected memory cell by referring to the information PS Info. described above, compare the obtained program speed and the threshold value THV, and determine at least one program loop from among the program loops performed on the selected memory cell to include the HCI program operation based on a result of the comparing.

According to an embodiment, the HCI program controller 114b may obtain a second program speed A_1, i.e., program speed information with respect to a selected memory cell when the selected memory cell is included in a first memory block BLK0 and connected to a second word line WL_1. The HCI program controller 114b may compare the second program speed A_1 and a first threshold value TH_0, and determine at least one program loop from among program loops performed with respect to the selected memory cell to include the HCI program operation when the second program speed A_1 is smaller than the first threshold value TH_0. Then, the HCI program controller 114b may control the HCI program operation performed on the selected memory cell (e.g., the second word line WL_1) based on a result of the determining.

However, the information PS info. of FIG. 18B is only an example, and alternatively, the information PS Info. may include information indicating whether the HCI program operation is performed according to word lines or memory cells, and may include various pieces of information enabling the HCI program controller 114b to obtain a program speed of the memory cell.

For example, the HCI program controller 114b may determine at least one program loop from among program loops performed on a selected memory cell to include an HCI program operation based on a program speed of the selected memory cell, and then perform the HCI program operation.

Figure 19:
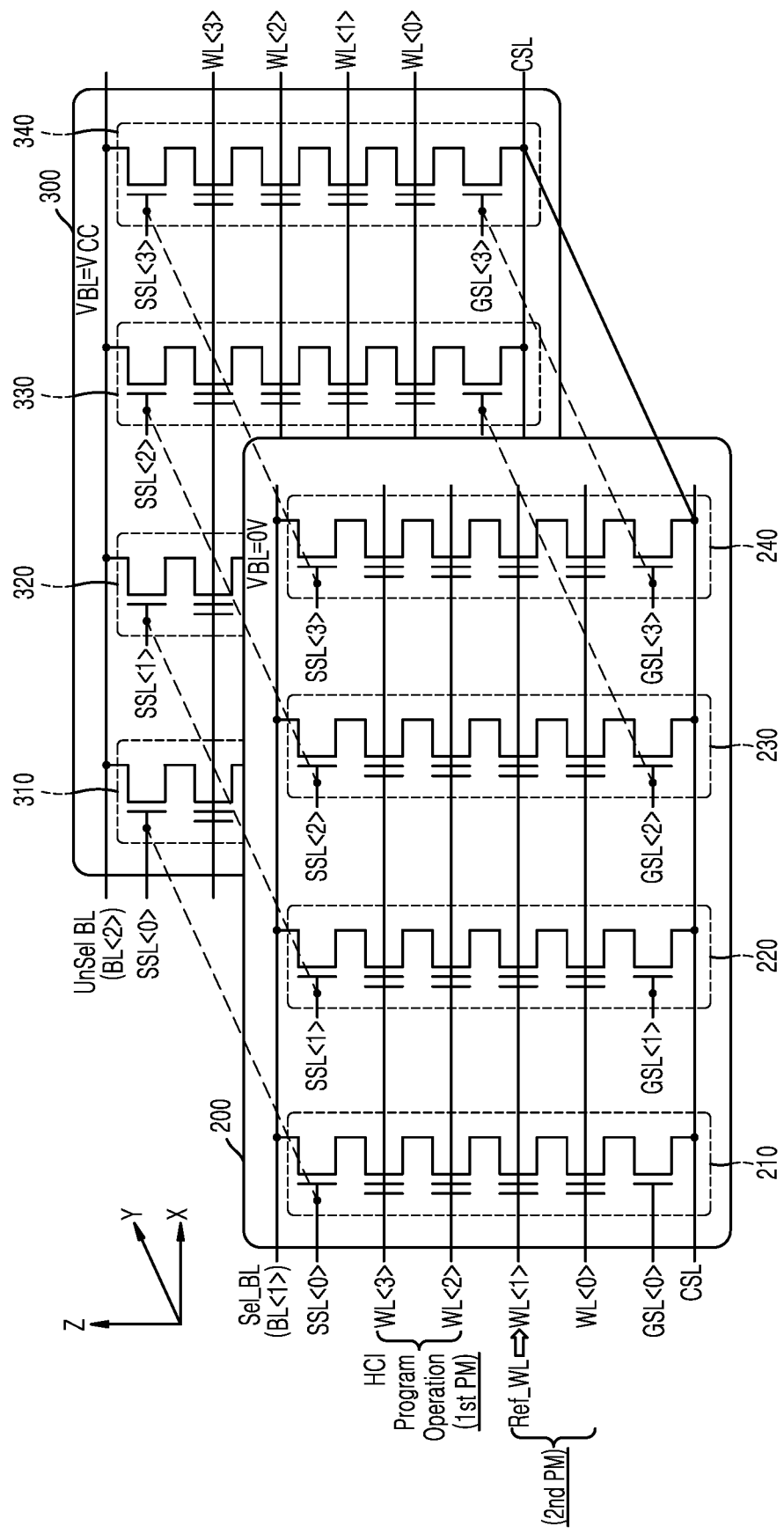
FIG. 19 is a diagram for describing an HCI program method applied to a 3-dimensional (3D) memory device, according to example embodiments.

FIG. 19 is a diagram for describing an HCI program method applied to a 3D memory device, according to example embodiments.

Referring to FIGS. 2 and 19, the memory cell array 160 may include a cell string group 200 connected to a selected bit line Sel_BL (BL<1>) and a cell string group 300 connected to an unselected bit line Unsel_BL (BL<2>). The cell string groups 200 and 300 may respectively include a plurality of cell strings 210 through 240 and 310 through 340. Hereinafter, it is described that a selected cell string is the cell string 210 connected to a string select line SSL<0> from among the cell strings 210 through 240 connected to a selected bit line BL<1>.

According to an embodiment, the HCI program controller 114 may set a reference word line Ref_WL (WL<1>) in consideration of characteristics of the 3D memory device. While a program operation is performed, the HCI program controller 114 may determine at least one program loop from among a plurality of program loops performed on a selected memory cell to include an HCI program operation when a selected word line is included in word lines between the reference word line Ref_WL (WL<1>) and the string select line SSL<0>. According to an embodiment, when a first selected word line (for example, word line WL<2> or WL<3>) is provided between the reference word line Ref_WL (WL<1>) and the string select line SSL<0>, a program operation may be performed according to a first program method 1st PM including the HCI program operation described with reference to FIG. 1.

When a word line WL<0> is a select word line, the selected word line is not included in the word lines between the reference word line Ref_WL (WL<1>) and the string select line SSL<0>, and thus a plurality of program loops performed on a selected memory cell connected to the word line WL<0> and included in the cell string 210 may not include an HCI program operation. According to an embodiment, in a second selected word line (for example, word line WL<1> or WL<0>), a program operation may be performed based on a second program method 2nd PM different from the first program method 1st PM.

The first selected word line (e.g., WL<2> or WL<3>) may be disposed more adjacently to the selected bit line Sel_BL (BL<1>) than the second selected word line (e.g., WL<1> or WL<0>). Unlike the first program method 1st PM, the second program method 2nd PM may be a program method using F-N tunneling by applying a certain program voltage to the selected memory cell and applying a pass voltage to memory cells of the cell string 210 excluding the selected memory cell. For example, the second program method 2nd PM may not include the HCI program method.

Also, when the word line WL<2> or WL<3> is a selected word line, the selected word line is included in the word lines between the reference word line Ref_WL (WL<1>) and the string select line SSL<0>, and thus at least one program loop from among a plurality of program loops performed on a selected memory cell included in the cell string 210 and connected to the word line WL<2> or WL<3> may include the HCI program operation. Here, as described with reference to FIG. 14A, the HCI program controller 114 may select the at least one program loop from among the plurality of program loops performed on the selected memory cell connected to the word line WL<2> or WL<3> and included in the cell string 210, and control the HCI program operation while performing the selected at least one program loop.

However, the cell string groups 200 and 300 of FIG. 19 are only examples, and a cell string group may include more word lines and string select lines.

Figure 20:
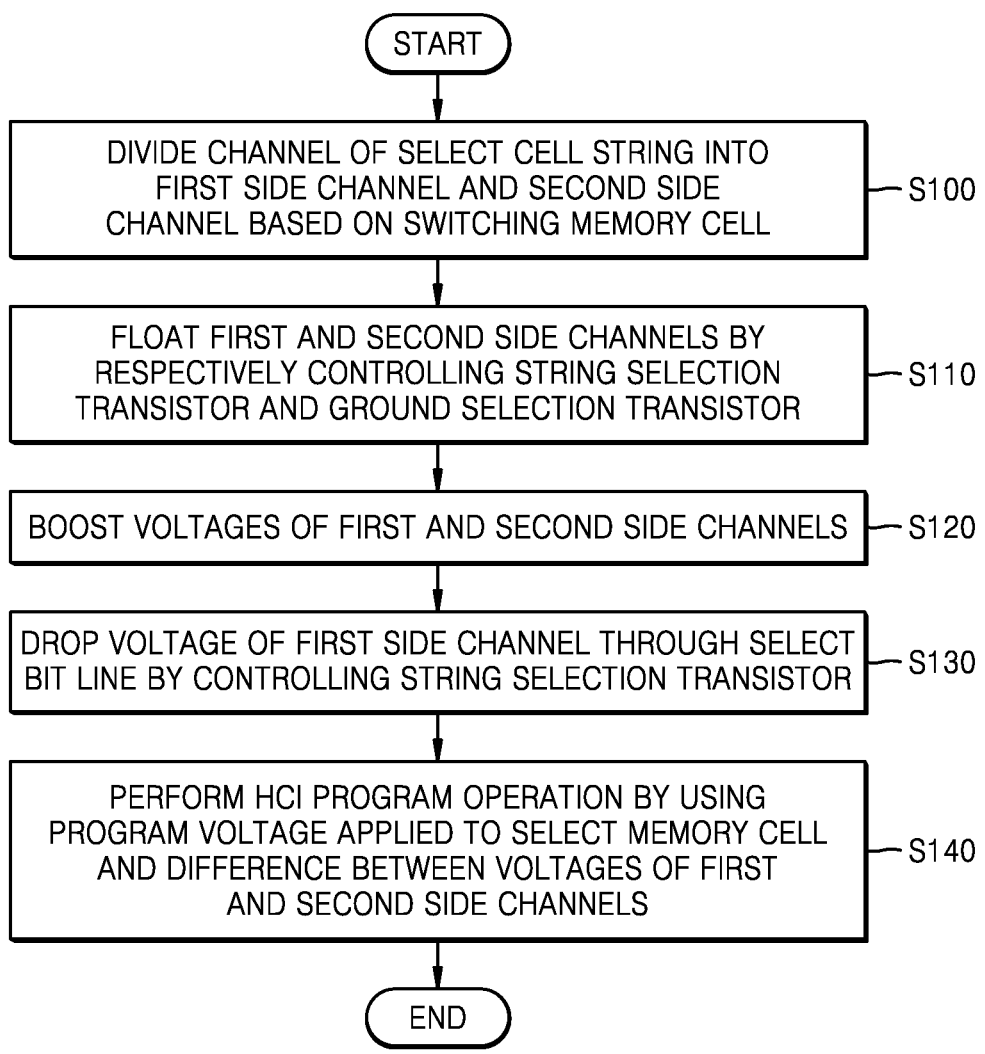
FIG. 20 is a schematic flowchart of an HCI program method, according to example embodiments.

FIG. 20 is a schematic flowchart of an HCI program method, according to example embodiments.

Referring to FIG. 20, first, a channel of a selected cell string is divided into a first side channel and a second side channel based on a switching memory cell adjacent to a selected memory cell included in the selected cell string, in operation S100. The first and second side channels are floated by respectively controlling a string selection transistor and a ground selection transistor included in the selected cell string, in operation S110. Voltages of the first and second side channels are boosted by using a certain program voltage and a pass voltage, in operation S120. The voltage of the first side channel drops through a selected bit line by controlling the string selection transistor, in operation S130. An HCI program operation is performed on the selected memory cell by using the program voltage applied to the selected memory cell and a difference between the voltages of the first and second side channels, in operation S140.

Figure 21:
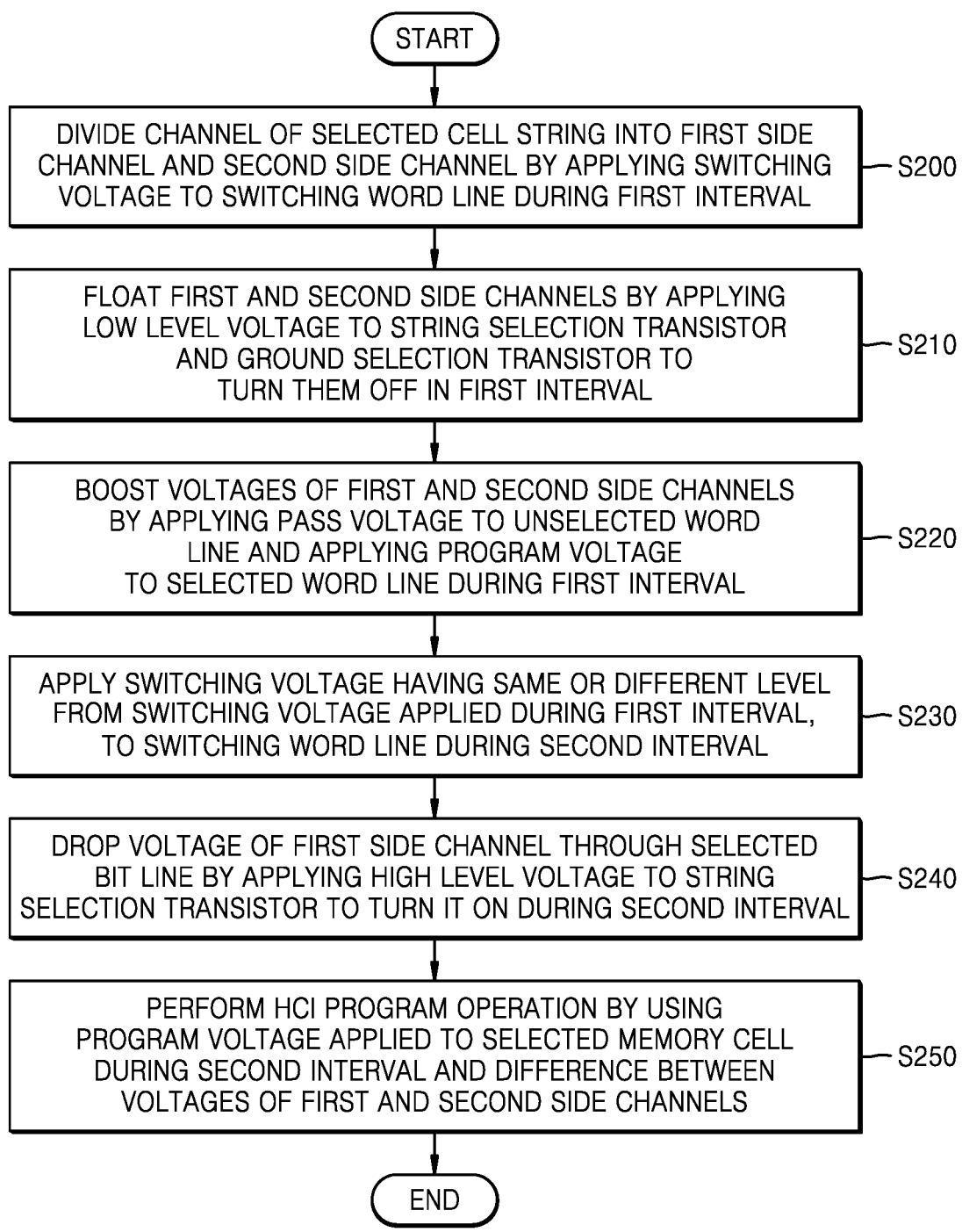
FIG. 21 is a detailed flowchart of an HCI program method, according to example embodiments.

FIG. 21 is a detailed flowchart of an HCI program method, according to example embodiments.

Referring to FIG. 21, a channel of a selected cell string is divided into a first side channel and a second side channel by applying a switching voltage to a switching word line during a first interval included in a program loop, in operation S200. The first and second side channels are floated by applying a low level voltage to a string selection transistor and a ground selection transistor to turn them off in the first interval, in operation S210. Voltages of the first and second side channels are boosted by applying a pass voltage to an unselected word line and applying a program voltage greater than the pass voltage to a selected word line during the first interval, in operation S220. A switching voltage having the same or different level from the switching voltage applied in the first interval is applied to a switching word line during a second interval included in the program loop, in operation S230. The voltage of the first side channel drops through a selected bit line by applying a high level voltage to the string selection transistor to turn it on during the second interval, in operation S240. An HCI program operation is performed by using the program voltage applied to the selected memory cell during the second interval and a difference between the voltages of the first and second side channels, in operation S250.

Figure 22:
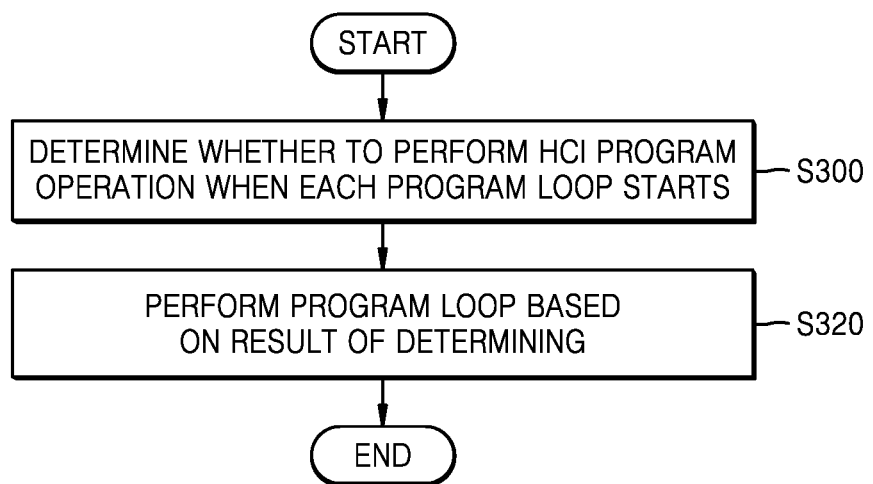
FIG. 22 is a schematic flowchart of a method of selectively performing an HCI program operation, according to example embodiments.

FIG. 22 is a schematic flowchart of a method of selectively performing an HCI program operation, according to example embodiments.

Referring to FIG. 22, it is determined whether the HCI program operation is to be performed when each program loop starts, in operation S300. The program loop may perform based on a result of the determining, in operation S320. Accordingly, the HCI program operation may be selectively performed according to the program loop.

Figure 23:
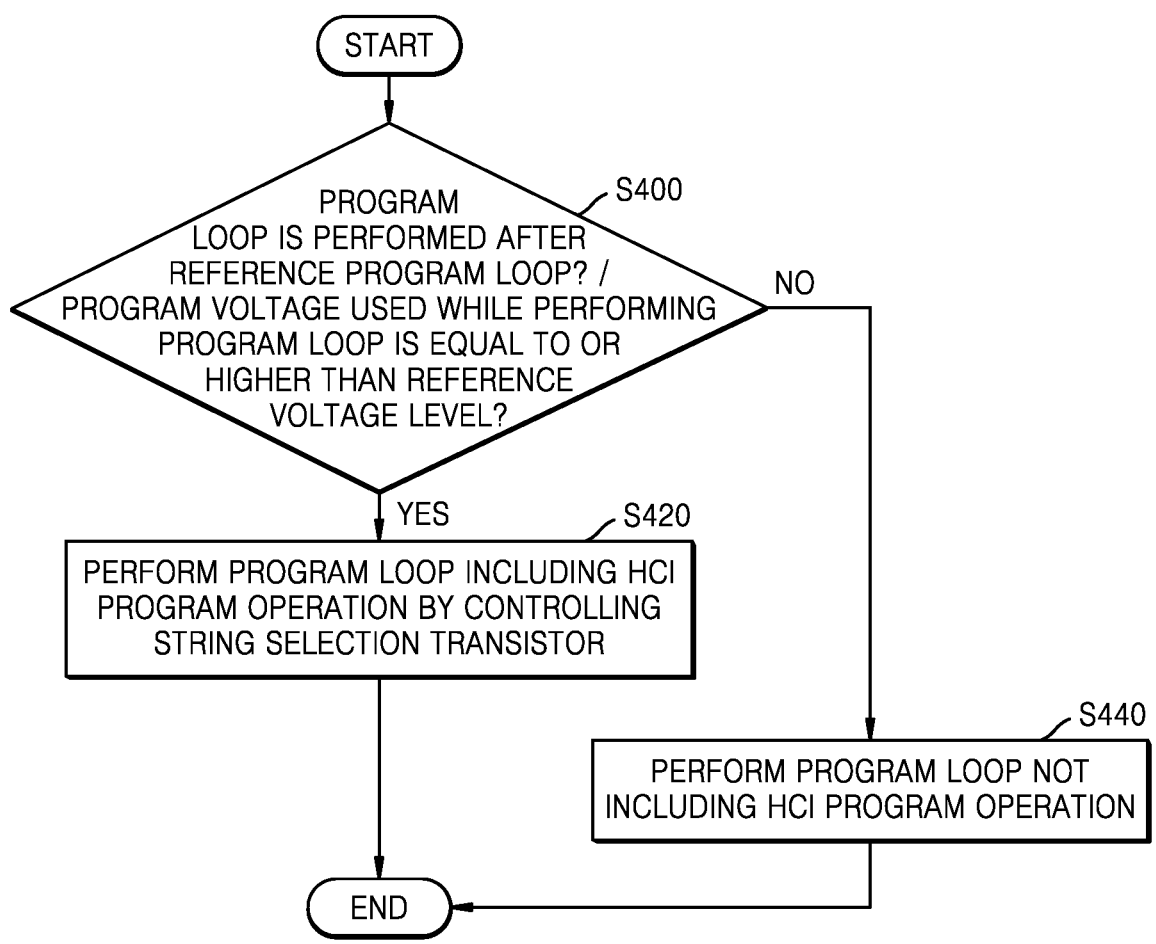
FIG. 23 is a detailed flowchart of a method of selectively performing an HCI program operation, according to example embodiments.

FIG. 23 is a detailed flowchart of a method of selectively performing an HCI program operation, according to example embodiments.

Referring to FIG. 23, it is determined whether a program loop to be performed is a program loop performed after a reference program loop, or whether a program voltage used while performing a program loop is equal to or higher than a reference voltage level, in operation S400. When it is determined that the program loop to be performed is performed after the reference program loop or that the program voltage is equal or higher than the reference voltage level in operation S400, a program loop including an HCI program operation is performed by controlling a string selection transistor included in a selected cell string in operation S420. When is determined that the program loop to be performed is not performed after the reference program loop or that the program voltage is lower than the reference voltage level in operation S400, a program loop not including an HCI program operation is performed in operation S440.

Figure 24A:
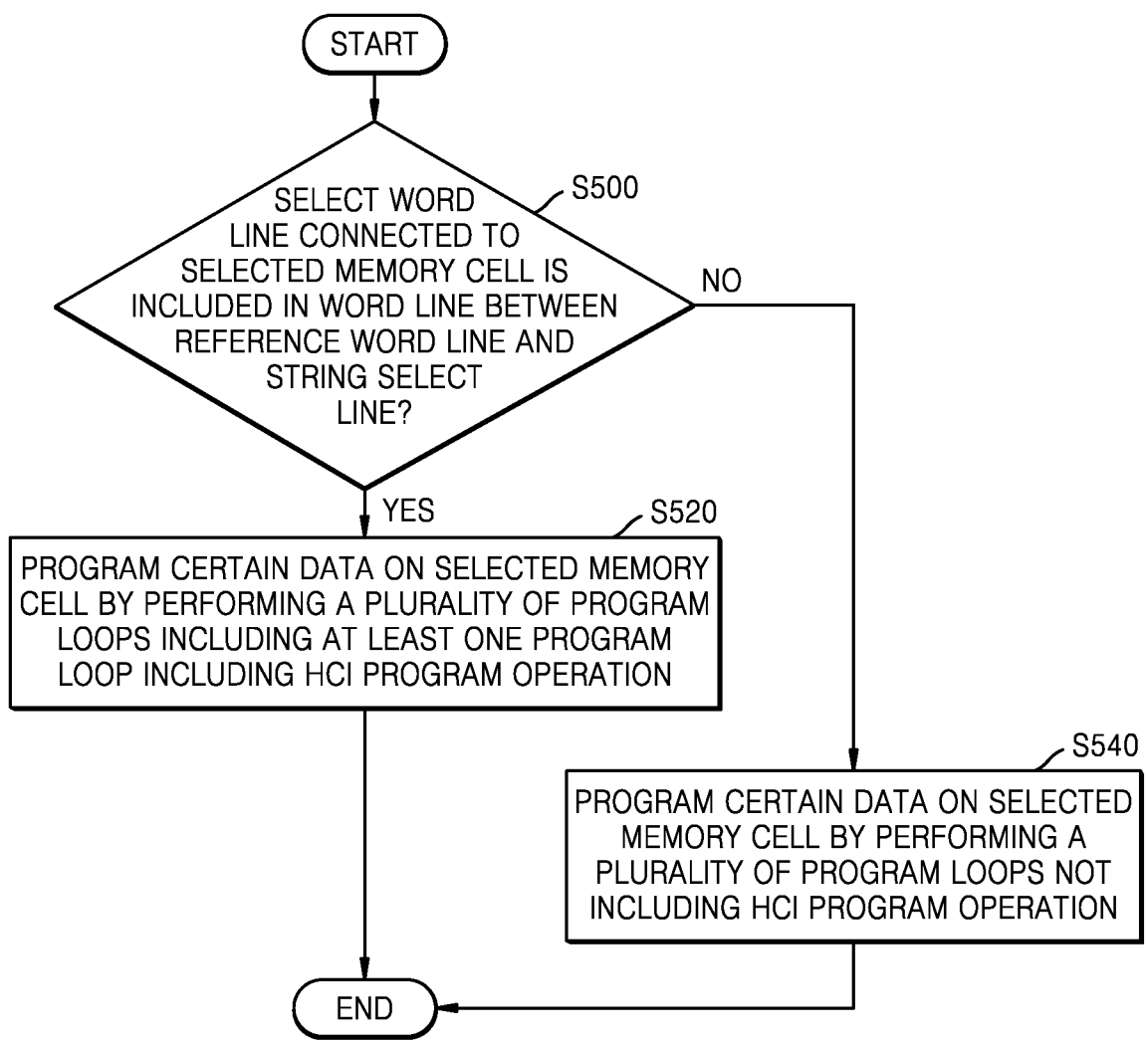
FIGS. 24A and 24B are flowcharts of methods of selectively performing an HCI program operation on a 3D memory device, according to example embodiments.
Figure 24B:
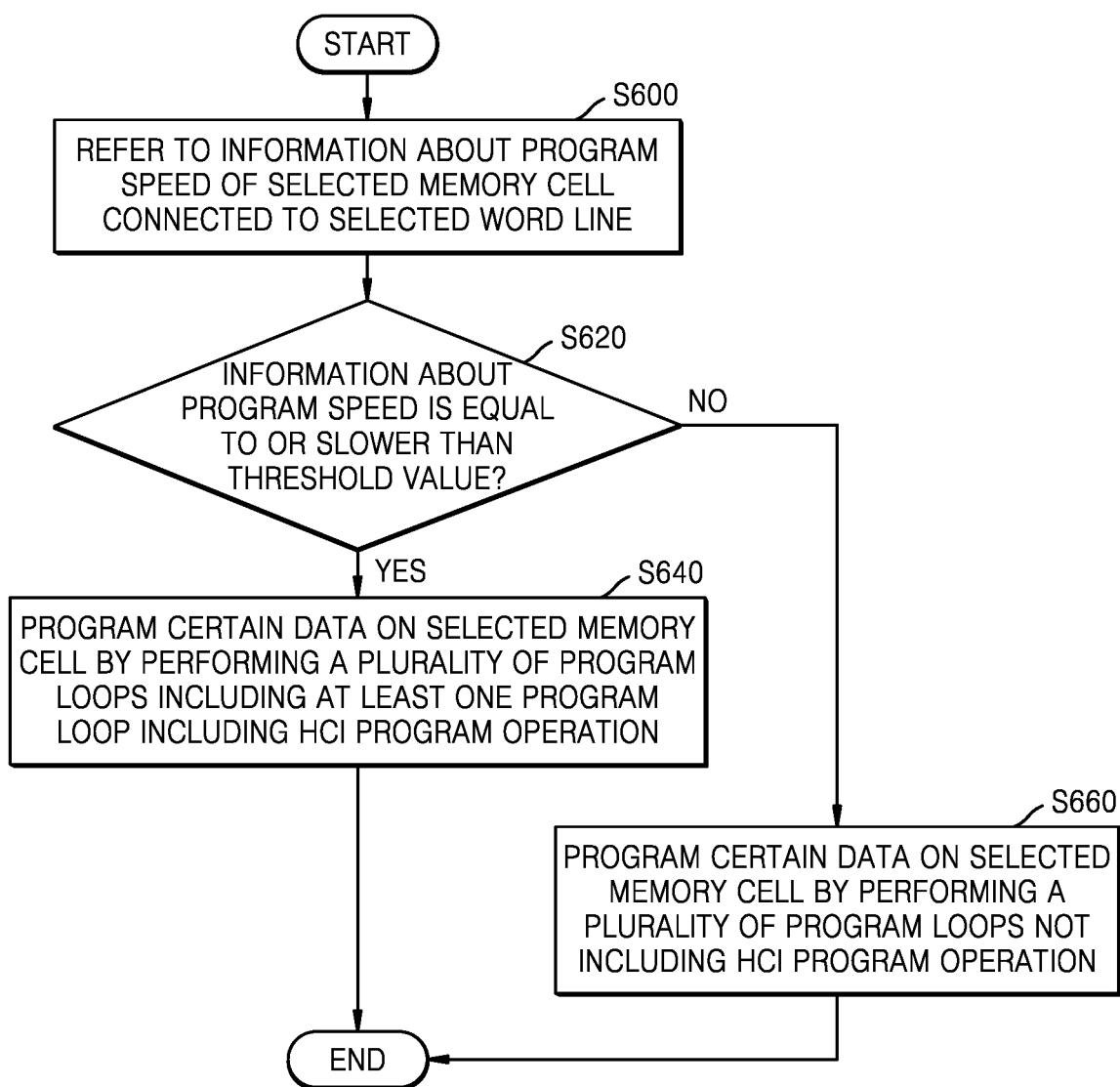

FIGS. 24A and 24B are flowcharts of methods of selectively performing an HCI program operation on a 3D memory device, according to example embodiments.

Referring to FIG. 24A, it is determined whether a selected word line connected to a selected memory cell is included in word lines between a reference word line and a string select line, in operation S500. When it is determined that the selected word line is included in the word lines between the reference word line and the string select line in operation S500, certain data is programmed on the selected memory cell by performing a plurality of program loops including at least one program loop including an HCI program operation, in operation S520. When it is determined that the selected word line is not included in the word lines between the reference word line and the string select line in operation S500, certain data is programmed on the selected memory cell by performing a plurality of program loops not including an HCI program operation, in operation S540.

Referring to FIG. 24B, information about a program speed of a selected memory cell connected to a selected word line to be programmed is referred to in operation S600. It is determined whether the information about the program speed is equal to or slower than a threshold value, in operation S620. When it is determined that the information about the program speed is equal to or slower than the threshold value in operation S620, certain data is programmed on the selected memory cell by performing a plurality of program loops including at least one program loop including an HCI program operation, in operation S640. When it is determined that the information about the program speed is not equal to or slower than the threshold value in operation S620, certain data may be programmed on the selected memory cell by performing a plurality of program loops not including an HCI program operation, in operation S660.

Figure 25:
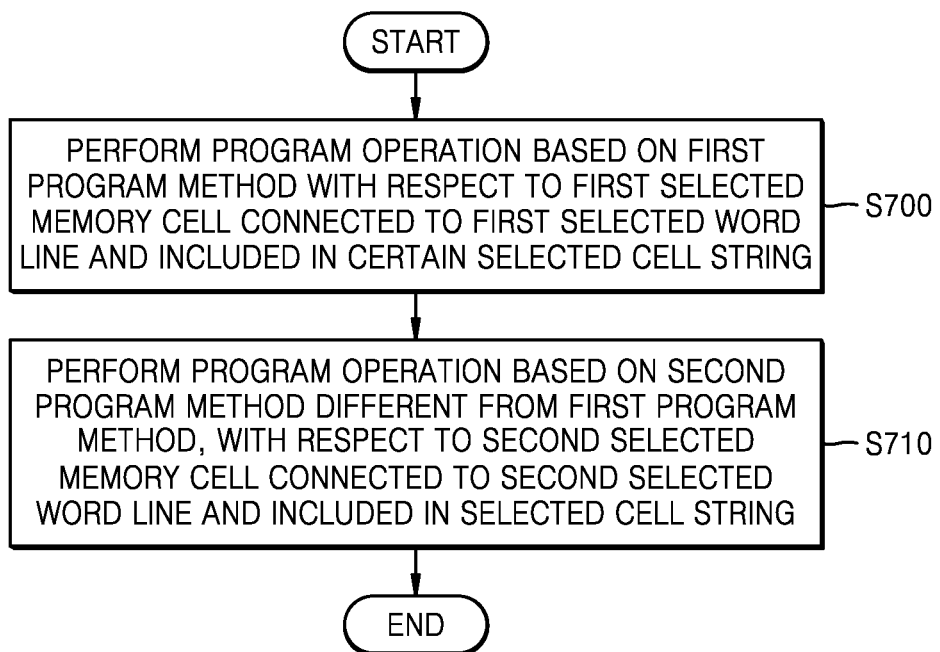
FIG. 25 is a flowchart of a method of varying a program method according to a location of a selected memory cell, according to example embodiments.

FIG. 25 is a flowchart of a method of varying a program method according to a location of a selected memory cell, according to example embodiments.

Referring to FIG. 25, a nonvolatile memory device according to an embodiment performs a program operation based on a first program method with respect to a first selected memory cell connected to a first selected word line and included in a certain selected cell string, in operation S700. As described with reference to FIG. 19, the first program method may include an HCI program method. The nonvolatile memory device according to an embodiment performs a program operation based on a second program method different from the first program method, with respect to a second selected memory cell connected to a second selected word line and included in the selected cell string, in operation S710. The second program method may be a program method using only F-N tunneling, as described with reference to FIG. 19.

Figure 26:
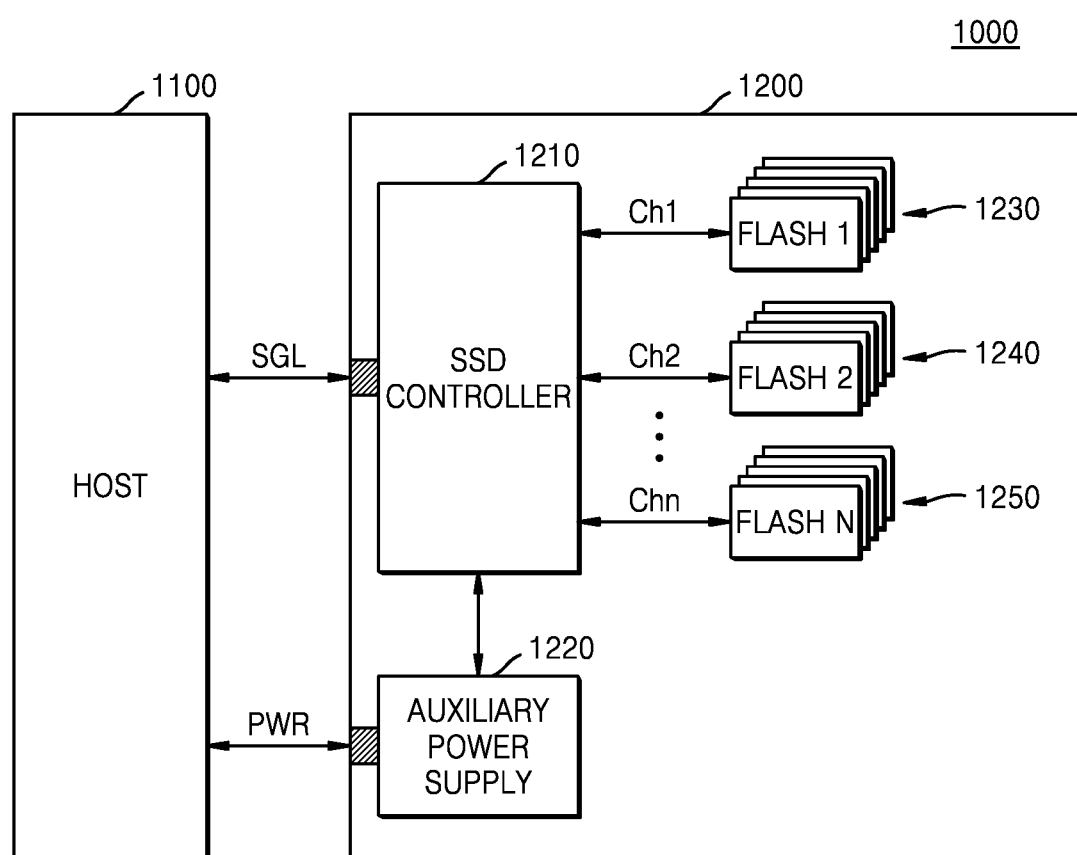
FIG. 26 is a block diagram of a solid state disk (SSD) system according to example embodiments.

FIG. 26 is a block diagram of a solid state disk (SSD) system 1000 according to example embodiments.

Referring to FIG. 26, the SSD system 1000 may include a host 1100 and an SSD 1200. The SSD 1200 exchanges a signal with the host 1100 through a signal line SGL, and receives power through a power line PWR. The SSD 1200 may include an SSD controller 1210, an auxiliary power supply 1220, and a plurality of memory devices 1230 through 1250.

For example, the plurality of memory devices 1230 through 1250 may perform an HCI program operation by controlling a string selection transistor while performing at least one of a plurality of program loops. Also, the plurality of memory devices 1230 through 1250 may select some of the plurality of program loops and control the HCI program operation while performing the selected program loops.

In example embodiments, a memory card, a nonvolatile memory device, and a card controller according to example embodiments may be mounted by using any one of various types of packages. For example, a flash memory device and/or a memory controller according to an embodiment may be mounted by using any one of packages, such as package on package (POP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline integrated circuit (SOIC), shrink small outline package (SSOP), thin small outline package (TSOP), system in package (SIP), multi chip package (MCP), wafer-level fabricated package (WFP), and wafer-level processed stack package (WSP).

While the present disclosure has been particularly shown and described with reference to embodiments thereof, it will be understood that various changes in form and details may be made therein without departing from the spirit and scope of the following claims.

What is claimed is:

1. A program method of a 3-dimensional memory device, the program method comprising:
    performing a plurality of first program loops for a first selected memory cell connected to a first selected word line based on a first program method; and
    performing a plurality of second program loops for a second selected memory cell connected to a second selected word line based on a second program method,
    wherein a first step pattern of a plurality of first program voltages used in each of the plurality of first program loops is changed from a predetermined program loop among the plurality of first program loops,
    wherein a second step pattern of a plurality of second program voltages used in each of the plurality of second program loops is based on a constant offset,
    wherein a voltage level of the first step pattern used in two or more program loops of the plurality of first program loops before the predetermined program loop increases based on the constant offset, and
    wherein a level variance between a first program voltage of the plurality of first program voltages applied to the first selected word line in the predetermined program loop and a second program voltage of the plurality of first program voltages applied to the first selected word line in the immediately previous program loop of the predetermined program loop is different from a level variance between the first program voltage and a third program voltage of the plurality of first program voltages applied to the first selected word line in the next program loop of the predetermined program loop.

2. The program method of claim 1, wherein the first step pattern is changed from a pattern in which a voltage level used in each of the plurality of first program loops before the predetermined program loop increases by an offset to a pattern in which a voltage level used in each of the others of the plurality of first program loops is maintained at a constant level.

3. The program method of claim 1, wherein a voltage level of the first step pattern increases by a first offset and then decreases by a predetermined level, and then increases by a second offset.

4. The program method of claim 3, wherein the first and second offsets are variable according to a temperature condition of the 3-dimensional memory device.

5. The program method of claim 3, wherein the predetermined program loop is variable according to a temperature condition of the 3-dimensional memory device.

6. The program method of claim 1, wherein a first diameter of a channel hole corresponding to the first selected memory cell is larger than a second diameter of a channel hole corresponding to the second selected memory cell.

7. The program method of claim 1, wherein the first selected word line is located closer to a string select line than the second selected word line.

8. The program method of claim 1, wherein some of the plurality of first program loops before the predetermined program loop are performed based on a F-N tunneling program operation method, and the others of the plurality of second program loops are performed based on the F-N tunneling program operation method and a hot carrier injection (HCI) program method.

9. A 3-dimensional memory device, comprising:
    a memory block including a plurality of vertically stacked memory cells; and
    a control logic configured to control a program operation for the memory block,
    wherein the control logic is configured to:
    control a first program method to be changed based on a predetermined program loop among a plurality of first program loops for a first selected memory cells connected to a first selected word line of the memory block,
    control a second program method for a second selected memory cells connected to a second selected word line of the memory block,
    control a voltage level of a first step pattern of program voltages used in two or more program loops of the plurality of first program loops before the predetermined program loop to increase based on a constant offset, and
    control a level variance between a first program voltage of the plurality of first program voltages applied to the first selected word line in the predetermined program loop and a second program voltage of the plurality of first program voltages applied to the first selected word line in the immediately previous program loop of the predetermined program loop being different from a level variance between the first program voltage and a third program voltage of the plurality of first program voltages applied to the first selected word line in the next program loop of the predetermined program loop.

10. The 3-dimensional memory device of claim 9, wherein the control logic is configured to:
    control some of the plurality of first program loops before the predetermined program loop based on a F-N tunneling program operation method,
    control the others of the plurality of first program loops based on the F-N tunneling program operation method and a hot carrier injection (HCI) program operation method, and
    control all of a plurality of second program loops based on the F-N tunneling program operation method.

11. The 3-dimensional memory device of claim 9, wherein the control logic is configured to control a voltage level of a first step pattern of the program voltages used in two or more program loops of the plurality of first program loops to change from a pattern in which the voltage level increases by an offset to a pattern in which the voltage level is maintained at a constant level.

12. The 3-dimensional memory device of claim 9, wherein the control logic is configured to control a voltage level of a first step pattern of the program voltages used in two or more program loops of the plurality of first program loops to increase by a first offset and then decrease by a predetermined level, and then increase by a second offset.

13. The 3-dimensional memory device of claim 9, wherein the first selected word line is located between a string select line of the memory block and a reference word line of the memory block, and
　　wherein the second selected word line is located between the reference word line and a ground select line of the memory block.

\* \* \* \* \*